(12) United States Patent
Wang et al.

(10) Patent No.: US 10,096,509 B2
(45) Date of Patent: Oct. 9, 2018

(54) SUBSTRATE CARRIER SYSTEM WITH PROTECTIVE COVERING

(71) Applicant: Applied Materials, Inc., Santa Clara, CA (US)

(72) Inventors: Zuoqian Wang, Dublin, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 117 days.

(21) Appl. No.: 15/123,231

(22) PCT Filed: Apr. 2, 2015

(86) PCT No.: PCT/US2015/024147
§ 371 (c)(1),
(2) Date: Sep. 1, 2016

(87) PCT Pub. No.: WO2015/171226
PCT Pub. Date: Nov. 12, 2015

(65) Prior Publication Data
US 2018/0166316 A1 Jun. 14, 2018

Related U.S. Application Data

(60) Provisional application No. 61/991,350, filed on May 9, 2014.

(51) Int. Cl.
*H01L 21/00* (2006.01)
*H01L 21/687* (2006.01)
(Continued)

(52) U.S. Cl.
CPC .... *H01L 21/68757* (2013.01); *H01L 21/6831* (2013.01); *H01L 21/68785* (2013.01); *H01L 51/001* (2013.01); *H01L 51/56* (2013.01)

(58) Field of Classification Search
CPC . H01L 21/68785; H01L 51/001; H01L 51/56; H01L 21/6831
See application file for complete search history.

(56) References Cited

U.S. PATENT DOCUMENTS 6,678,143 B2   1/2004  Masuda et al.
6,768,627 B1   7/2004  Kitabayashi et al.
(Continued)

FOREIGN PATENT DOCUMENTS

JP   H04237148 A    8/1992
JP   2002-357838 A  12/2002
(Continued)

OTHER PUBLICATIONS

International Search Report and Written Opinion, PCT/US2015/024147, dated Jul. 14, 2015.

*Primary Examiner* — Richard Booth
(74) *Attorney, Agent, or Firm* — Patterson + Sheridan, LLP

(57) ABSTRACT

Embodiments disclosed herein generally relate to a substrate carrier system suitable for clamping a substrate and optionally a mask, the substrate carrier system having a stack of removable protective layers. In one embodiment, substrate carrier system is provide that includes a substrate carrier body having a protective layer stack disposed an outer mounting surface of the substrate carrier body. The substrate carrier body is configured to be transported into and out of a processing chamber. The protective layer stack has a plurality of removable protective layers which can be removed as needed to expose a "new" surface for chucking a substrate thereon.

20 Claims, 12 Drawing Sheets

(51) Int. Cl.
  *H01L 51/00*   (2006.01)
  *H01L 51/56*   (2006.01)
  *H01L 21/683*  (2006.01)

(56) References Cited

U.S. PATENT DOCUMENTS

| | | |
|---|---|---|
| 6,781,812 B2 | 8/2004 | Fuwa et al. |
| 7,881,036 B2 | 2/2011 | Fujisawa et al. |
| 7,916,447 B2 | 3/2011 | Kobayashi et al. |
| 8,238,072 B2 | 8/2012 | Fujisawa et al. |
| 8,325,457 B2 | 12/2012 | Park et al. |
| 8,335,070 B2 | 12/2012 | Poh |
| 8,503,156 B2 | 8/2013 | Ray et al. |
| 8,730,644 B2 | 5/2014 | Fujisawa et al. |
| 9,287,806 B2 | 3/2016 | Park |
| 2002/0135967 A1* | 9/2002 | Fuwa ............... C23C 14/50 361/234 |
| 2008/0037194 A1 | 2/2008 | Kamitani et al. |
| 2008/0062609 A1 | 3/2008 | Himori et al. |
| 2012/0227886 A1 | 9/2012 | Hsiao et al. |
| 2013/0019797 A1 | 1/2013 | Tanaka et al. |
| 2013/0288477 A1 | 10/2013 | Rieschl et al. |
| 2015/0331337 A1 | 11/2015 | Sundarrajan et al. |
| 2016/0064267 A1 | 3/2016 | Toh et al. |

FOREIGN PATENT DOCUMENTS

| | | |
|---|---|---|
| JP | 2003-179128 A | 6/2003 |
| JP | 2003-243493 A | 8/2003 |
| JP | 2009-088558 A | 4/2009 |

\* cited by examiner

SUBSTRATE CARRIER SYSTEM WITH PROTECTIVE COVERING

FIELD

The embodiments disclosed generally relate to a substrate carrier and more particularly, a substrate carrier with a protective covering and an integrated electrostatic chuck suitable for use in vertical and other processing systems.

BACKGROUND

Substrate carriers are sometimes used to position substrates in substrate processing systems used for coating architectural glass, fabricating solar panels, and fabricating flat panel and OLED displays, among others. The substrates are often greater than 1 square meter in size, and thus, each substrate represents a significant investment to the manufacturer over the course of processing.

Backside scratching is particularly problematic when handling these substrates, as scratches may provide an initiation point for cracking and chipping of the substrate, resulting in a substantial loss of the investment incurred in processing the substrate to that point in time. As the substrate is secured to a substrate supporting surface of the substrate carrier, the condition of the substrate supporting surface must be designed and monitored with prevention of scratching in mind. Carriers having hard substrate supporting surfaces are often more prone to scratching or otherwise damaging the substrate. Conversely, carriers having soft substrate supporting surfaces are often more prone to having debris becoming embedded therein, which then becomes a potential scratch source. Thus, the condition of the substrate supporting surface is important for ensuring good fabrication yields.

Therefore, a need exists for an improved apparatus and method for securing substrates to a substrate carrier.

SUMMARY

The embodiments disclosed herein generally relate to a substrate carrier system suitable for clamping a substrate and optionally a mask, the substrate carrier system having a stack of removable protective layers. In one embodiment, substrate carrier system is provided that includes a substrate carrier body having a protective layer stack disposed an outer mounting surface of the substrate carrier body. The substrate carrier body is configured to be transported into and out of a processing chamber. The substrate carrier body has an outer mounting surface and an electrode assembly. The electrode assembly includes a plurality of laterally spaced apart sets of electrodes. The protective layer stack disposed on the outer mounting surface of the substrate carrier body has a plurality of removable protective layers. Each protective layer is adhered to at least one other removable protective layer in the stack. An outermost layer of the plurality of removable protective layers defines the substrate supporting surface of the substrate carrier for chucking a substrate thereon.

In another embodiment, a vacuum processing system is provided. The vacuum processing system includes vacuum processing chamber, a substrate carrier system, and a transport mechanism. The substrate carrier system includes substrate carrier body having an outer mounting surface and an electrode assembly. The electrode assembly is operable to secure a substrate to the substrate carrier system when energized. A protective layer stack is coupled to the outer mounting surface of the substrate carrier body. The protective layer stack has a plurality of removable protective layers and defines a substrate supporting surface of the substrate carrier system. The transport mechanism is operable to move the substrate carrier system into and out of the vacuum processing chamber while maintaining a substantially vertical orientation of the outer mounting surface.

In yet another embodiment, a method for transferring a substrate is provided. The method may include removing a substrate carrier system a vacuum processing chamber, removing an outer protective layer of a plurality of protective layers comprising a protective layer stack disposed on an outer mounting surface of the substrate carrier system to expose an underlying protective layer of the plurality of protective layers to define a virgin substrate supporting surface, loading a substrate on the virgin substrate supporting surface, and transporting the substrate disposed on the virgin substrate supporting surface into the vacuum processing chamber.

BRIEF DESCRIPTION OF THE DRAWINGS

So that the manner in which the above recited features of the embodiments disclosed above can be understood in detail, a more particular description, briefly summarized above, may be had by reference to the following embodiments, some of which are illustrated in the appended drawings. It is to be noted, however, that the appended drawings illustrate only typical embodiments and are therefore not to be considered limiting of its scope to exclude other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The embodiments disclosed generally relate to a substrate carrier system suitable for clamping a substrate and optionally a mask, the substrate carrier system having a stack of removable protective layers. The stack of removable protective layers protects the substrate from the substrate carrier system, thus reducing the potential for scratching or otherwise damaging the substrate. Since the protective layers are individually removable, the top protective layer on which the substrate is supported may be easily removed once damaged, worn or contaminated to expose an underlying protective layer which provides a virgin surface of the substrate to be secured against without having to resurface or otherwise service the substrate carrier system. Although the substrate carrier system disclosed herein is particularly suitable for use in OLED fabrication, the substrate carrier system may also be beneficially utilized in flat panel display, solar cell, architectural glass or other flat substrate process wherein improved control of chucking the substrate to a substrate carrier system is desirable.

Figure 1A:
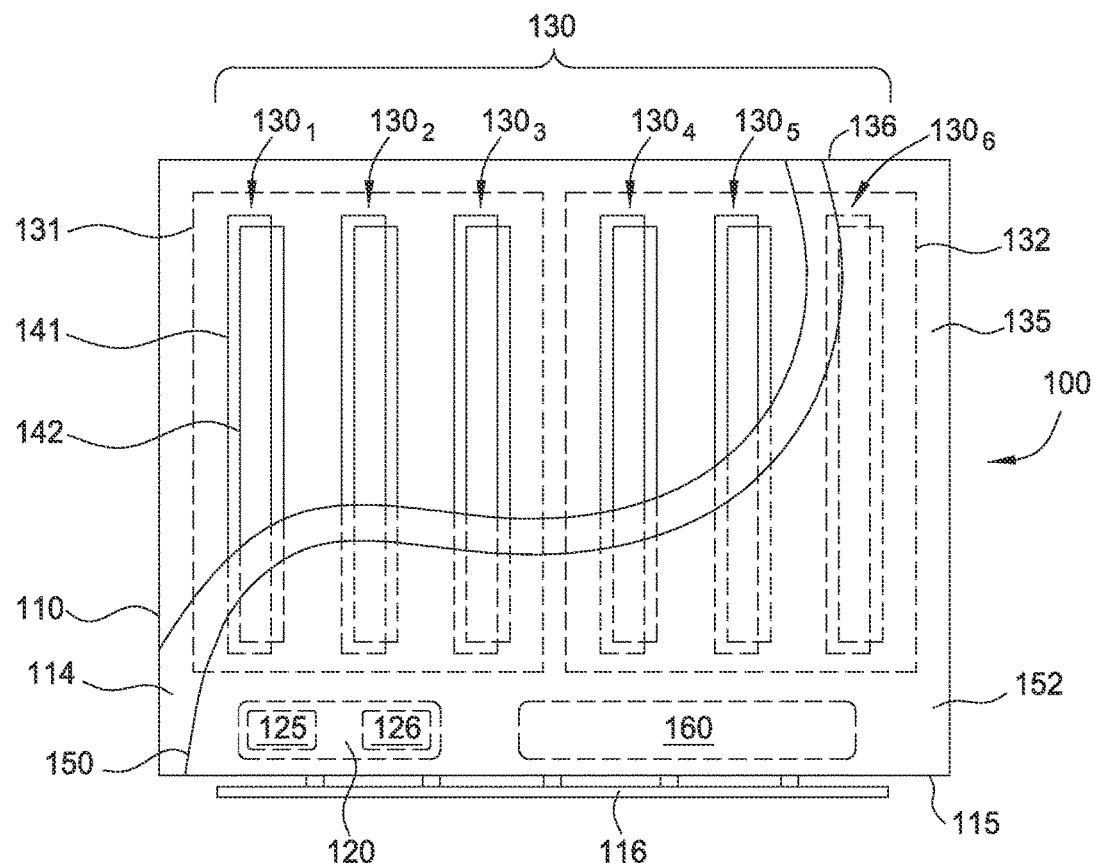
FIG. 1A is a front sectional view of a substrate carrier system having a protective layer stack of removable layers.

FIG. 1A is a front sectional view of a substrate carrier system 100 having a protective layer stack 150. The substrate carrier system 100 can be used to carry a substrate 10, and optionally a mask 20, through a processing system 50, as further described below with reference to FIG. 1D. The substrate carrier system 100 includes a substrate carrier body 110, an electrode assembly 135, a support base 112, and optionally one or more of a power supply 120, and a controller 160. The substrate carrier body 110 includes an outer mounting surface 114 on which the protective layer stack 150 is secured. The protective layer stack 150 includes a substrate supporting surface 152 on which the substrate 10 is secured to the substrate carrier body 110. In some embodiments, the electrode assembly 135 can be disposed in or on the substrate carrier body 110. The support base 112 can be disposed below or behind the substrate carrier body 110 to support the substrate carrier body 110 and the electrode assembly 135. The support base 112 may include a fluid reservoir or channels for heating and cooling. The support base 112 can have a high thermal mass relative to the substrate 10 to prevent rapid temperature fluctuations of the substrate 10 secured to the substrate carrier system 100. The support base 112 may be made of a metallic material, such as aluminum, and can be between about 1 cm and about 10 cm thick, for example about 2.5 cm thick.

The substrate carrier body 110, and thus the outer mounting surface 114, may be fabricated from a ceramic material. In some embodiments, the substrate carrier body 110 and/or the outer mounting surface 114 may be fabricated from a polymer. For example, the substrate carrier body 110 may be fabricated from a polymer or polymer sheets, such as polyimide, polyether ether ketone, polyaryletherketone, and the like. The substrate carrier body 110 and the outer mounting surface 114 may have a generally polygonal shape, such as a square or rectangular shape. However, it is contemplated that the outer mounting surface 114 of the substrate carrier body 110 may alternatively have another shape, such as circular.

The outer mounting surface 114 extends from a top 136 to a bottom 115 of the substrate carrier body 110. The outer mounting surface 114 completely covers the electrode assembly 135. The outer mounting surface 114 provides a surface on which the protective layer stack 150 is secured. In FIG. 1A, a portion of the protective layer stack 150 is cutaway to illustrate portions of the underlying outer mounting surface 114, while a portion of the outer mounting surface 114 underlying the protective layer stack 150 is cutaway to illustrate portions of the underlying electrode assembly 135.

Figure 1B:
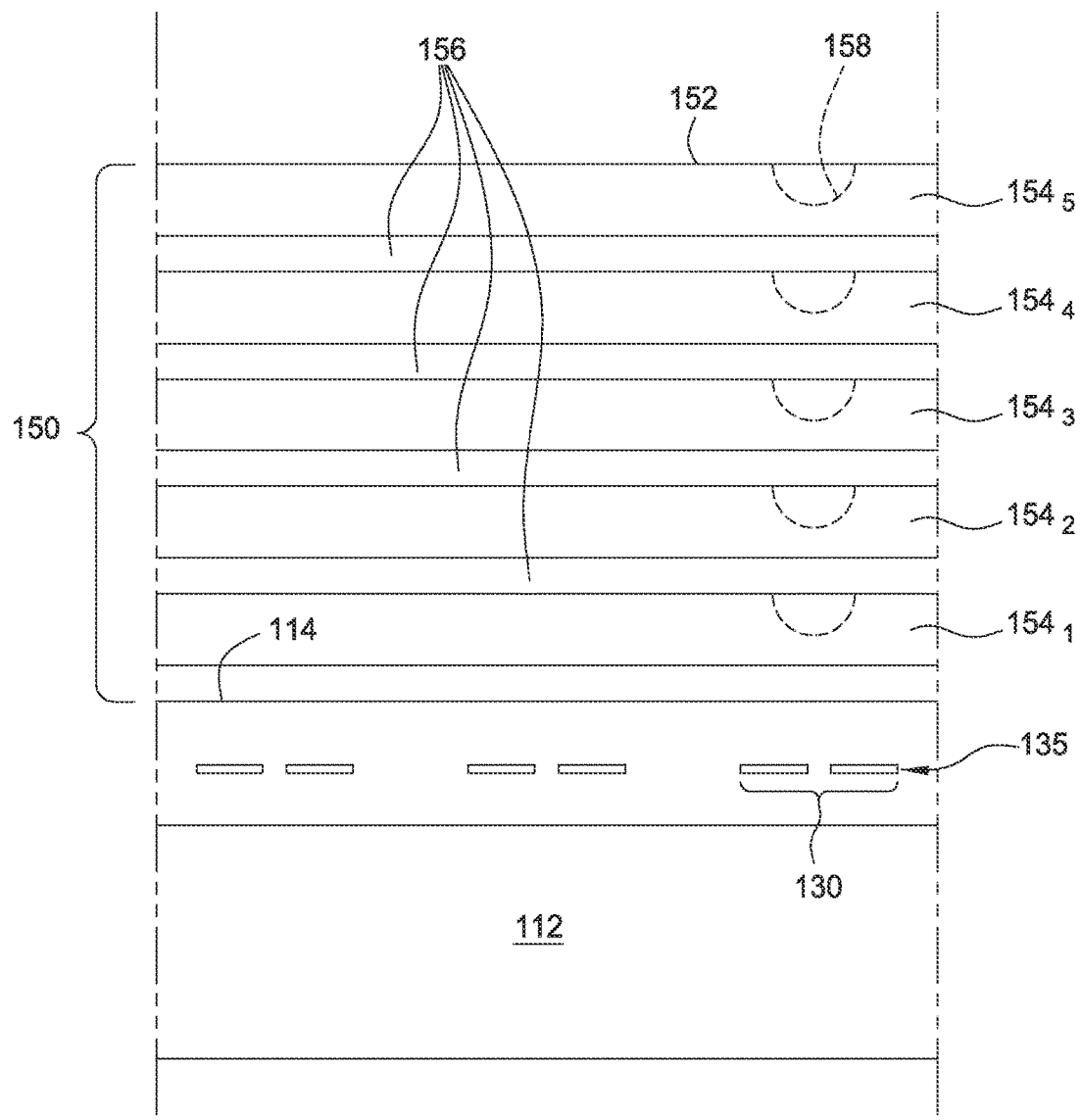
FIG. 1B is side sectional view of a portion of the substrate carrier system through the stack of removable layers.

FIG. 1B is a sectional view of a portion of the substrate carrier system 100 through the protective layer stack 150. The protective layer stack 150 includes a plurality of removable protective layers, collectively referred to as protective layers 154. Although five the protective layers are shown as protective layers $154_1$-$154_5$ in FIG. 1B, any suitable number of protective layers 154 may be utilized. For example, the protective layer stack 150 may comprise between 2 and about 50 protective layers 154, such as between 2 and about 50 protective layers 154.

The bottom protective layer 154 of the protective layer stack 150, shown as protective layer $154_1$ in FIG. 1B, is secured to the outer mounting surface 114 of the substrate carrier body 110. The outermost protective layer 154, which is exposed to the environment and shown as protective layer $154_5$ in FIG. 1B, defines a substrate supporting surface 152 on which the substrate 10 is chucked. As the exposed protective layer $154_5$ becomes worn, damaged or is removed as part of a preventative maintenance schedule, the worn protective layer $154_5$ is removed from the protective layer stack 150, leaving the newly exposed layer protective layer $154_4$ defining a virgin or "new" substrate supporting surface 152 on which the substrate 10 can subsequently be chucked. Once the protective layer $154_4$ becomes in need of replacement, the worn protective layer $154_4$ is removed from the protective layer stack 150, leaving the next underlying layer protective layer 154 exposed to defined the substrate supporting surface 152. The sequence of removing worn protective layers 154 can continue until finally the last protective layer $154_1$ is removed, at which time a new protective layer stack 150 may be secured to the outer mounting surface 114 of the substrate carrier body 110. By providing a "new" substrate supporting surface 152 each time one of the protective layers 154 is removed as needed, the probability of debris becoming embedded in the substrate supporting surface 152 is reduced. Moreover, since the substrate supporting surface 152 may be easily replaced by peeling or otherwise removing the top exposed protective layer 154 of the protective layer stack 150, the substrate supporting surface 152 may be maintained free of embedded material or other defects without having to re-surface the outer mounting surface 114 of the substrate carrier body 110 or otherwise replace the substrate carrier system 100, thus providing a significant reduction in preventative maintenance costs and downtime.

The protective layers 154 may be fabricated from a polymer or other suitable material. The use of a polymer for the protective layers 154 provides a soft surface that minimizes scratching of the substrate, particularly when the substrate carrier body 110 is fabricated from hard materials, such as ceramics. In some embodiments, the protective layers 154 may be fabricated from at least one of polyimide, polyester, polyether ether ketone, polyaryletherketone, or other suitable polymer. Each of the protective layers 154 may be between about 0.1 (about 0.00254 mm) and about 10 mils (about 0.254 mm) thick, for example between about 0.5 mils (about 0.127 mm) and about 4 mils (about 0.1016 mm) thick. In one example, each of the protective layers 154 is about 2 mils (about 0.0508 mm) thick.

Non-permanent adhesive layers 156 may be utilized between the protective layers 154 to allow each protective layer 154 to be selectively removed as the outermost layer defining the substrate supporting surface 152 becomes in need of replacement. In one embodiment, the adhesive layers 156 are a silicon-based adhesive that allows each protective layer 154 to be peeled away from the underlying protective layer 154. The bottom of the protective layer 154 may be treated, for example by etching or plasma treating, so that the adhesive layer 156 preferentially sticks to and is peeled away with the overlying protective layer 154 so that the newly exposed substrate supporting surface 152 on the underlying protective layer 154 is substantially adhesive-free once the overlying protective layer 154 is removed.

In some embodiments, one, more or all of the protective layers 154 may include a wear indicator 158. The wear indicator 158 may be used to determine when the protective layer 154 that defines the substrate supporting surface 152 is in need of replacement. In one embodiment, wear indicator 158 may be a visual indicator, such as printing, pattern or color disposed on or formed in the protective layer 154. For example, the wear indicator 158 may be a colored portion of the protective layer 154, which when worn away, indicates that the protective layer 154 that defines the substrate supporting surface 152 should be removed to exposed the underlying protective layer 154. In another example, the wear indicator 158 may be a colored portion of the protective layer 154 disposed below the substrate supporting surface 152, which when the substrate supporting surface 152 is worn away, becomes exposed to indicate that the protective layer 154 should be replaced. Other wear indicators 158 that may be utilized include grooves, blind holes, recesses or other surface features that can be worn away to indicate a need to remove the protective layer 154 defining the exposed substrate supporting surface 152. Alternatively, the protective layer 154 defining the exposed substrate supporting surface 152 may be removed to exposed the underlying protective layer 154 based on other criteria, for example such as duration of use, number of substrates processed on the exposed substrate supporting surface 152, or results from a visual or other inspection.

Referring back to FIG. 1A, the electrode assembly 135 includes a plurality of laterally spaced apart electrode sets 130. Each electrode set 130 includes a first electrode 141 interleaved with a second electrode 142. The electrode assembly 135 may be embedded in the substrate carrier body 110. For example, the electrode assembly 135 may be embedded in ceramic material comprising the substrate carrier body 110 or disposed between polymer sheets comprising the substrate carrier body 110. In yet embodiments, the electrode assembly 135 may be disposed on a printed circuit board (PCB) disposed on the substrate carrier body 110. Conductors coupling the electrode assembly 135 to the controller 160 may be formed on or in the substrate carrier body 110 or PCB, or within grooves of the substrate carrier body 110 or PCB. The electrode assembly 135 can be designed to have a substantially similar shape to the outer mounting surface 114. In some embodiments, the electrode assembly 135 as viewed through the outer mounting surface 114 of the substrate carrier body 110 may be rectangular and have height and width dimensions ranging between about 0.1 m to about 10 m.

In the embodiment illustrated in FIG. 1A the electrode sets 130 of the electrode assembly 135 have a vertical orientation and are laterally spaced apart in columns, although other orientations may be utilized. For example, the electrode sets 130 can be arranged in a grid pattern, a polar array, circular pattern or other pattern. Although only a few individual electrode sets 130, such as electrode sets 130$_{1-6}$, are shown in FIG. 1A, in some embodiments there can be many more individual electrode sets 130 comprising the electrode assembly 135, so that the individually controllable electrodes 141, 142 can be used to precisely control the clamping forces exerted through different areas of the outer mounting surface 114.

As discussed above, each individual electrode set 130 includes at least two interleaving electrodes, shown in FIG. 1A as electrodes 141, 142. The electrodes 141, 142 are independently controlled by the controller 160 so that different electrical properties (e.g., current, voltage, etc.) can be applied to the electrodes 141, 142 within a single electrode set 130. Additionally, each electrode 141, 142 comprising one electrode set 130 may be controlled differently than electrodes 141, 142 comprising a different electrode set 130.

The power supply 120 and the controller 160, as well as associated electrical and electronic devices and wiring may be disposed in or otherwise connected to the substrate carrier body 110. In some embodiments, one or both of the controller 160 and power supply 120 may be located on or in the support base 112. In other embodiments, the power supply 120 and the controller 160 may be located remotely with respect to the substrate carrier body 110. The power supply 120 is configured to supply power to the electrode sets 130. The power supply 120 can include a battery 125 and an optional charger 126.

The controller 160 may be configured to select a first group 131 of the electrode sets 130 and a second group 132 of the electrode sets 130, so that different voltages or currents can be provided to the first group 131 relative to the second group 132 of the electrode sets 130. As will be described in further detail below, the first group 131 of electrode sets 130 can be used to electrostatically clamp the substrate 10 to the substrate carrier system 100, and the second group 132 of electrodes sets 130 can be used to electrostatically or electromagnetically clamp the mask 20 over the substrate 10 to the substrate carrier system 100. Which electrode sets 130 are included in the first group 131 and the second group 132 can change during processing, so that the mask 20 can be clamped to different areas of the substrate 10.

The substrate carrier system 100 can also include a guide rail 116 to aid in transporting the substrate carrier body 110 and the substrate 10. The guide rail 116 may have an orientation substantially parallel with a plane of the outer mounting surface 114. The guide rail 116 may be coupled to or extend from a bottom 115 the substrate carrier body 110 or the support base 112. The guide rail 116 can be configured to interface with a transfer mechanism of a drive system, as discussed further below with reference to FIG. 1C.

FIG. 1B is a block diagram showing exemplary electrical connections to the electrode assembly 135 in accordance with one embodiment. The power supply 120 can be configured to supply at least a first clamping voltage, and optionally in some embodiments, one or more of a second clamping voltage and a clamping current to the electrode sets 130. The first clamping voltage can be supplied from a first clamping voltage terminal 121. In one embodiment, the second clamping voltage can be provided from a second clamping voltage terminal 122, while in another embodiment, the clamping current can be supplied from a clamping current terminal 123. The clamping current can be provided at the first clamping voltage, the second clamping voltage, or another suitable voltage.

Each electrode set 130 can be coupled to a respective switching device 171-174, such as a solid state switch, contactor or relay. Each switching device 171-174 can be coupled to a respective control circuit 181-184 to enable the controller 160 to provide one or more control signals to the switching devices 171-174. The control circuits 181-184 are shown as individual hard-wired connections, but other means for providing a control signal could be used, such as a fieldbus, or a wireless transmitter/receiver, among others. Each switching device 171-174 can have multiple connections (not shown) to the power supply 120 and the controller 160, so that a switching device, such as switching device 171, can couple an electrode set $130_1$ to the first clamping voltage, the second clamping voltage, or the clamping current based on the control signal sent to the switching device 171.

Figure 1C:
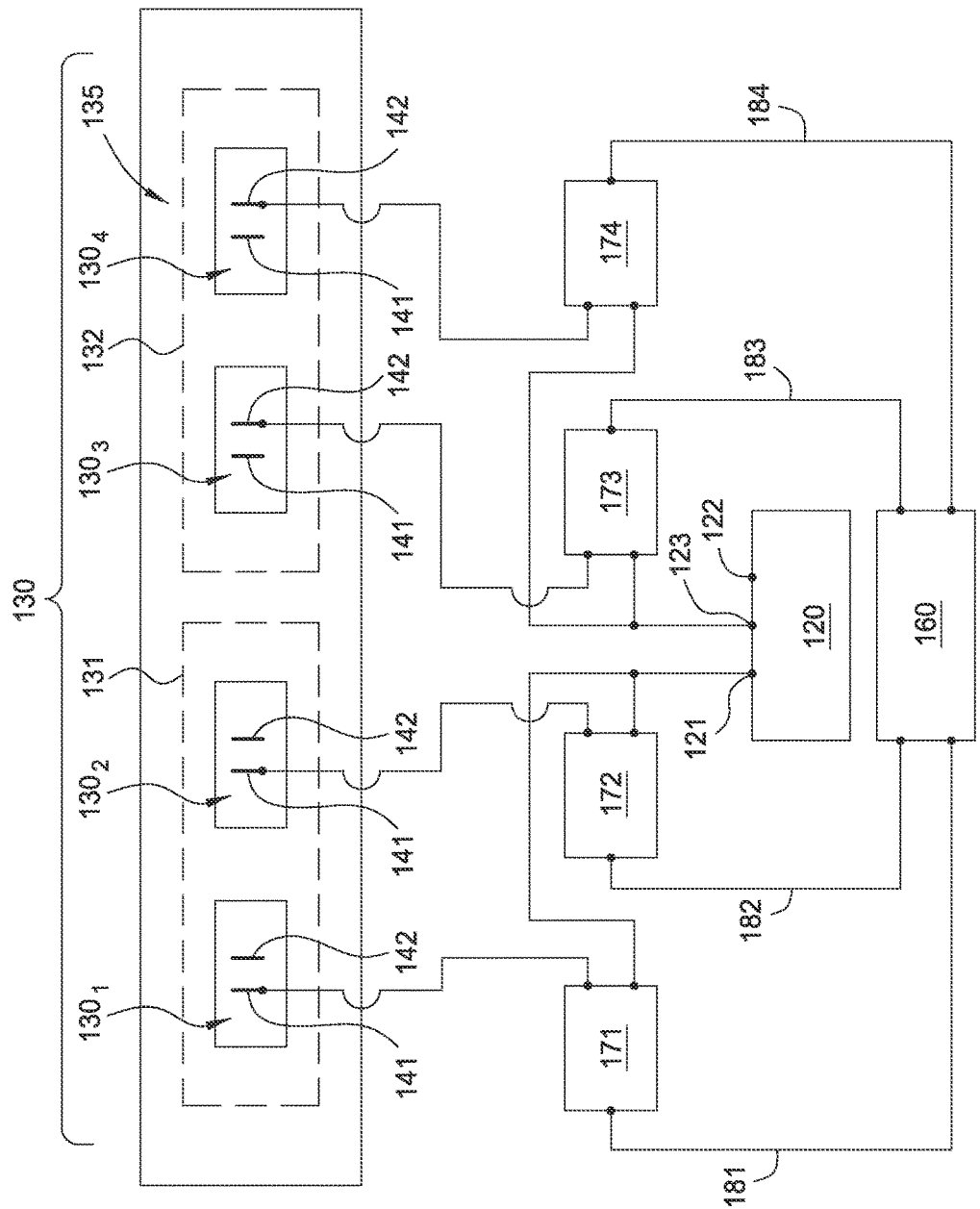
FIG. 1C is a block diagram showing exemplary electrical connections to an electrode assembly of a substrate carrier system.
Figure 1D:
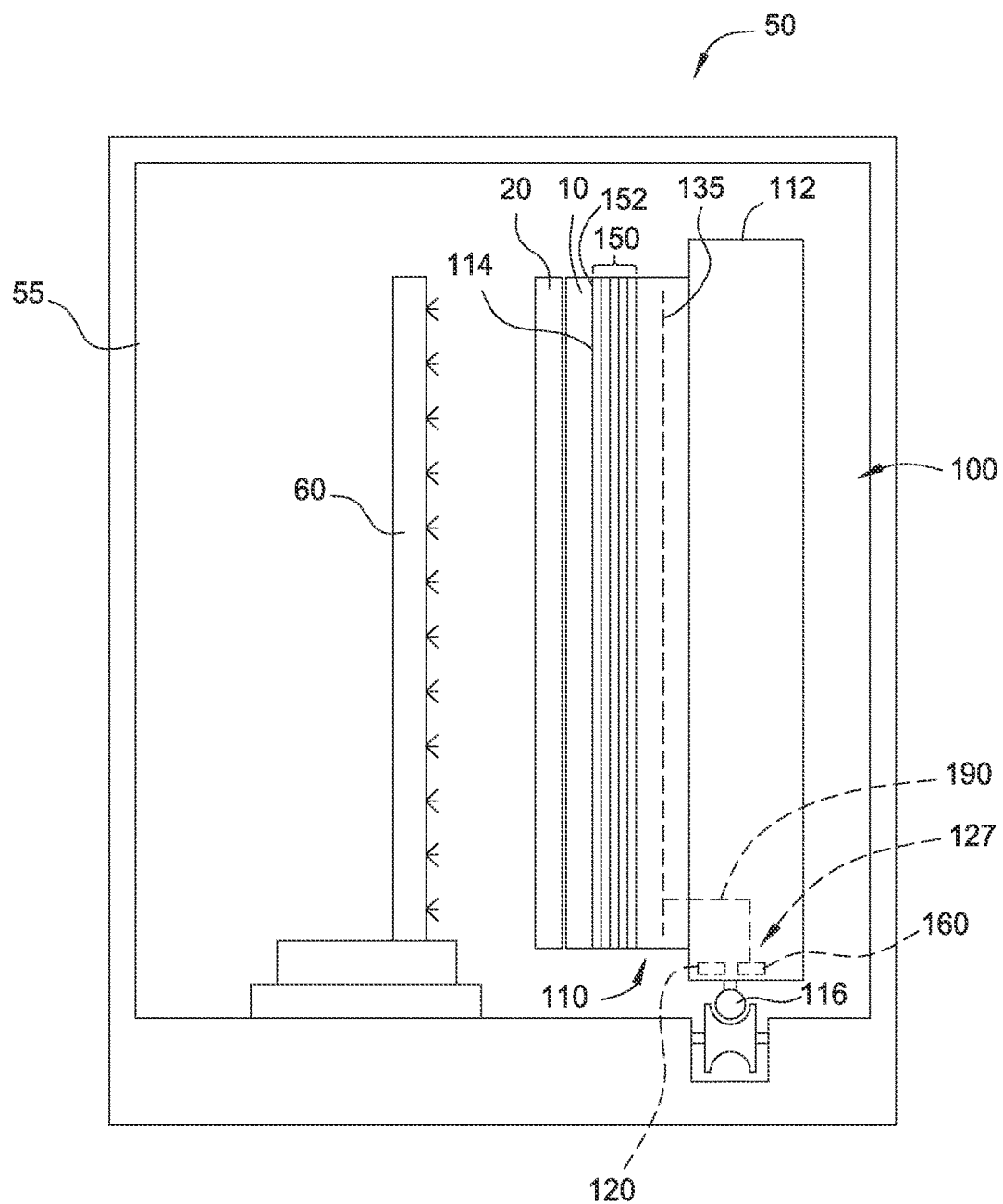
FIG. 1D is a side schematic sectional view of a substrate carrier system in a dispensing system, according to one embodiment.

The controller 160 can be configured to select which individual electrode sets 130 are included in a first group 131 of the electrode sets 130 and a second group 132 of the electrode sets 130. In example depicted in FIG. 1B, the first group 131 of the electrode sets 130 is selected by the controller 160 to include the electrode set $130_1$ and electrode set $130_2$, while the second group 132 is selected to include the electrode set $130_3$ and electrode set $130_4$. The controller 160 can be further configured to provide the first clamping voltage to at least the first group 131 of the electrode sets 130 to operate the first group 131 of the electrode sets 130 in a first chucking mode. For example in the first chucking mode, the controller 160 may operate to select the electrode set $130_1$ and electrode set $130_2$ to define the first group 131. Once the first group 131 is defined, the controller 160 may operate to provide control signals through control circuits 181, 182 to switching devices 171, 172, such that the first clamping voltage from terminal 121 is provided to electrode set $130_1$ and electrode set $130_2$. The first clamping voltage can be used to electrostatically clamp the substrate 10 to the protective layer stack 150 as illustrated in FIG. 1C.

The first clamping voltage may be ramped up so that the electrostatic force used to electrostatically clamp the substrate 10 to the protective layer stack 150 gradually increases to substantially prevent the substrate 10 from contacting the protective layer stack 150 in a manner that generates undesirable particles. Additionally, as each electrode set 130 in the first group 131 may be controlled independently form the other electrode sets 130 in the first group 131, the electrode sets 130 in the first group 131 may be energized or ramped up in a center to edge or edge to opposite edge sequence which chucks the substrate 10 to the protective layer stack 150 in a manner that substantially prevents air pockets from being trapped between the substrate 10 and the substrate supporting surface 152, which ultimately improves the flatness of the chucked substrate 10.

The controller 160 can also be configured to provide the second clamping voltage or the clamping current to at least the second group 132 of the electrode sets 130 to operate the second group 132 of the electrode sets 130 in a second chucking mode. For example the second chucking mode, the controller 160 may operate to provide control signals through control circuits 183, 184 to switching devices 173, 174 to supply the clamping current from terminal 123 to electrode set $130_3$ and electrode set $130_4$. The controller 160 may operate the electrode assembly 135 simultaneously in both the first chucking and second chucking modes. The second mode may be used to electromagnetically clamp the mask 20 over the substrate 10 to the protective layer stack 150 disposed on the outer mounting surface 114, as illustrated in FIG. 1C. Alternatively, the second chucking mode can be used to supply the second clamping voltage to electrostatically clamp the mask 20 over the substrate 10 to the protective layer stack 150, as illustrated in FIG. 1C.

The second clamping voltage or current may be ramped up so that the electrostatic or electromagnetic force used to clamp the mask 20 to the substrate 10 and the protective layer stack 150 disposed on the outer mounting surface 114 gradually increases to smoothly clamp the mask 20 to the substrate 10. Smoothly chucking the mask 20 enhances the positional accuracy of the mask 20 while substantially preventing generation of undesirable particles. Additionally, as each electrode set 130 in the first group 131 may be controlled independently form the other electrode sets 130 in the first group 131, the electrode sets 130 in the first group 131 may be energized or ramped up in a center to edge or edge to opposite edge sequence which chucks the mask to the protective layer stack 150 a manner that substantially prevents the mask 20 from bowing, which ultimately improves the flatness of mask 20 on top of the chucked substrate 10.

As referenced above, FIG. 1C is a schematic side sectional view of the substrate carrier system 100 disposed in a vacuum processing system 50. The substrate carrier system 100 carries the substrate 10 through the different chambers/modules of the processing system 50. Electronics 127 represent the controller 160 and power supply 120 that were visible in FIG. 1A. Electrical connections 190 represent the wiring and switching devices between the controller 160 and the electrode assembly 135 shown in FIG. 1B. The processing system 50 may be configured for deposition, etch, implantation, annealing or other processes. The processing system 50 can include a processing chamber 55. The processing chamber 55 includes substrate access ports sized to allow the substrate carrier system 100 with substrate chucked thereon to move into and out of the processing chamber 55. The processing chamber 55 may house a spray bar 60 for depositing materials on the substrate 10. In one embodiment, the materials may be deposited on the substrate 10 using a thermal evaporation technique performed in a vacuum within the processing chamber 55. For example, the spray bar 60 may be configured to deposit materials suitable for OLED device fabrication, such as organic materials. Some organic materials suitable for OLED fabrication include organometallic chelates (for example Tris(8-hydroxyquinolinato)aluminum (Alq3)), fluorescent and phosphorescent dyes and conjugated dendrimers. The substrate carrier system 100 can be used to carry and clamp the substrate 10 and a mask 20 to the substrate carrier system 100 during processing in the processing system 50. The guide rail 116 can be used to interface with a transport mechanism 117 to aid in positioning the substrate carrier system 100 within the processing chamber 55, and for moving the substrate carrier system 100 with substrate 10 chucked thereon into and out of the processing chamber 55. Once the substrate carrier system 100 is disposed in a processing position within the processing chamber 55, the spray bar 60 may translate across the substrate 10 retained to the substrate carrier system 100 by the electrode assembly 135. Referring to FIGS. 1B and 1C, controller 160 may adjust the control signals in order to supply the first clamping voltage or one or more of the damping current and the second clamping voltage to the different electrode sets 130 based on the lateral position of the spray bar 60 as the spray bar 60 traverses across the substrate 10.

Figure 2A:
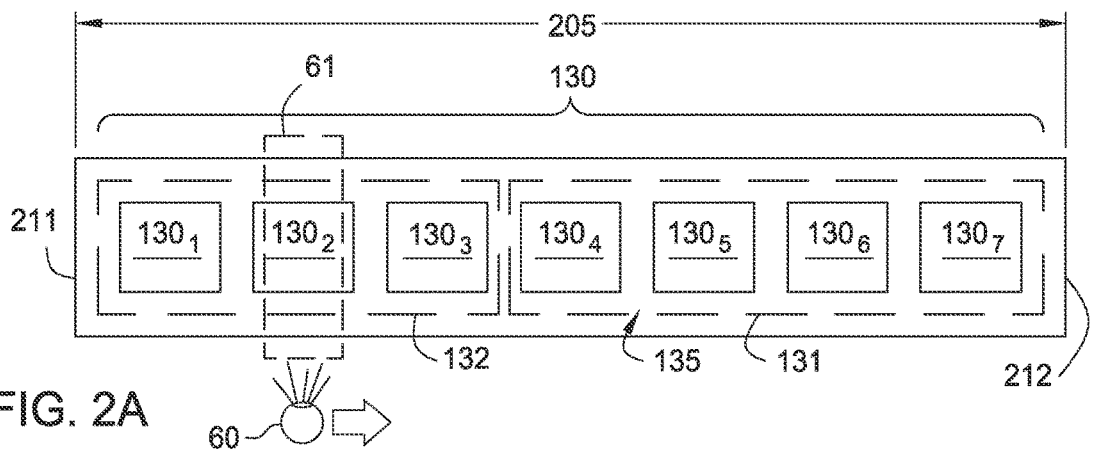
FIGS. 2A-2D illustrate a sequence of a spray bar translating past an electrode assembly to be used in accordance with one embodiment.

FIGS. 2A-2D illustrate a sequence for operating the electrode assembly 135 of the substrate carrier system 100 as the spray bar 60 translates across the electrode assembly 135 in accordance with one embodiment. In each of FIGS. 2A-2D, a top view of the electrode assembly 135 is schematically shown with the spray bar 60 in a different lateral position relative to the individual electrode sets 130 of the electrode assembly 135, As discussed above, the electrode assembly 135 may have a rectangular shape, having a width dimension 210 defined between a first end 211 and a second end 212 of the substrate carrier body 110. The electrode sets 130 may be laterally spaced apart between the first and second ends 211, 212 of the substrate carrier body 110 in the direction of the width dimension 210. Although FIGS. 2A-2D show seven individual electrode sets $130_1$-$130_7$, there can be more or less of individual electrode sets 130. The controller 160, not shown in FIGS. 2A-D, elects which electrode sets 130, shown as electrode sets $130_1$-$130_7$, are arranged into the first group 131 and the second group 132. The first group 131 typically includes a series of adjacent electrode sets, such as electrode sets $130_1$-$130_3$ as illustrated in FIG. 2A.

The controller 160 is configured to sequentially switch one or more electrode sets 130 from the second group 132 to the first group 131 in response to the relative position of the spray bar 60 to each individual electrode set 130. The controller 160 is also configured to switch electrode sets 130 from the first group 131 to the second group 132 in response to the relative position of the spray bar 60 to each individual electrode set 130. The sequence can be synchronized according to a position of the spray bar 60, shown as positions 61-64 in FIGS. 2A-2D, or any other external component relative to a reference, such as the first end 211 of the substrate carrier body 110. In one embodiment, the controller 160 is configured to sequentially switch electrode sets 130 from the first group 131 to the second group 132 from the first end 211 to the second end 212 of the electrode assembly 135 and the substrate carrier body 110.

In some embodiments, communication from proximity sensors or limit switches located in the processing chamber 55, or other signal external from the substrate carrier system 100, can be used to provide the controller 160 with a metric indicative of the position of the spray bar 60 relative to the individual electrode sets 130 of the electrode assembly 135 or the substrate carrier body 110. In response to the communication or signal, the controller 160 selects which electrode sets 130 are designated as belonging to the first group 131 and which electrode sets 130 are designated as belonging to the second group 132. In other embodiments, an analog sensor (not shown), such as a capacitive position detecting sensor, can be used to enable the controller 160 to continuously monitor the position of spray bar 60 relative to a reference in the processing system, such as the first end 211 of the substrate carrier body 110, in other embodiments, the spray bar 60 can translate across the substrate 10 according to a timed sequence executed by the controller 160 enabling the controller 160 to determine the position of the spray bar 60 based on the step or point in time of the timed sequence.

Referring first to FIG. 2A, the spray bar 60 is shown in a first position 61 in relation to the electrode assembly 135. The controller 160 is configured to select which of the electrode sets 130 are to comprise the first group 131 and operate in the first chucking mode and which of the electrode sets 130 are to comprise a second group 132 and operate in the second chucking mode. How the first and second chucking modes operate are discussed in further detail with reference to FIGS. 3A-5B below. The selection made by the controller 160 may be based on which electrode sets 130 are in closest proximity to the spray bar 60. For example, the controller 160 can select the electrode sets 130 in the second group 132 by including one or more electrode sets 130 directly in front of the spray bar 60 and including one or more electrode sets 130 to either side of the spray bar 60. Consequently, the second group 132 of FIG. 2A includes electrode set $130_2$ that is directly in front of the spray bar 60 and electrode sets $130_1$-$130_3$ that are immediately to either side of the spray bar 60.

The controller 160 can select the first group 131 by including all of the electrode sets 130 not included in the second group 132, such as electrode sets $130_4$-$130_7$ as shown in FIG. 2A. The controller 160 can be configured to couple the first clamping voltage to the electrode sets 130 in the first group 131 and couples the second clamping voltage or the clamping current to the electrode sets 130 in the second group 132. Electrode sets $130_4$-$130_7$ in the first group 131, operating in the first chucking mode, electrostatically clamp the substrate 10 to the substrate carrier system 100. Electrode sets $130_1$-$130_3$ in the second group 132, operating in the second chucking mode, either electrostatically or electromagnetically clamp the mask 20 over the substrate 10 to the substrate carrier system 100. Thus, the substrate carrier system 100 only clamps the mask 20 over an area of the substrate 10 that is directly in front of, or immediately proximate to, the spray bar 60. By only clamping the mask 20 over the area of the substrate 10 proximate the spray bar 60 which is actively having material deposited thereon, to positional accuracy of the mask 20 is maintained while enhancing the flatness of the mask 20 over the substrate 10. Moreover, by reducing the contact area of the mask 20 to the substrate 10 to only the region defined by the second group 132 of electrode sets 130, the potential for particle generation is reduced, which increases device yield and performance.

Figure 2B:
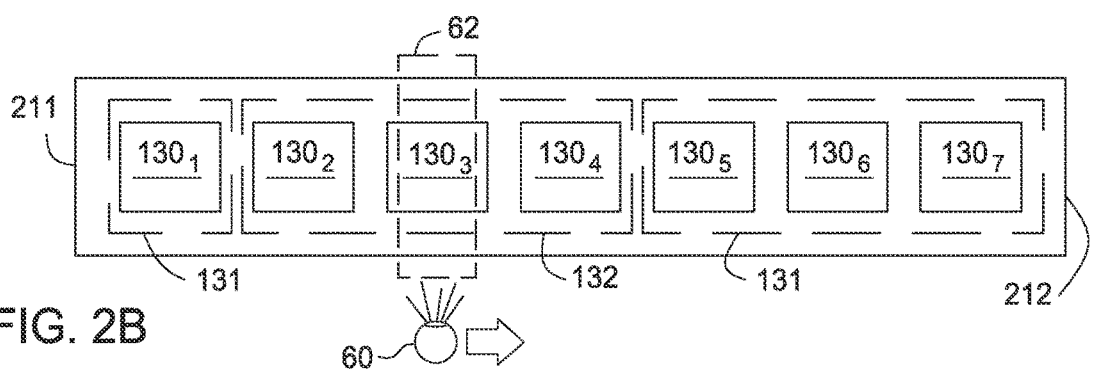

As the deposition sequence continues within the processing chamber 55, the spray bar 60 moves in a direction towards the second end 212 from the first position 61 to a second position 62 relative to the electrode assembly 135, as depicted in FIG. 2B. As the spray bar 60 translates from the first position 61 to the second position 62, the controller 160 re-determines which electrode sets 130 belong in the first and second groups 131, 132. For example, the controller 160 in response to a determination that the spray bar 60 is currently in the second position 62, switches (i.e., reassigns) one or more electrode sets 130, such as electrode set $130_1$, from the second group 132 to the first group 131. The controller 160 also switches reassigns) one or more electrode sets 130, such as electrode set $130_4$, from the first group 131 to the second group 132.

Figure 2C:
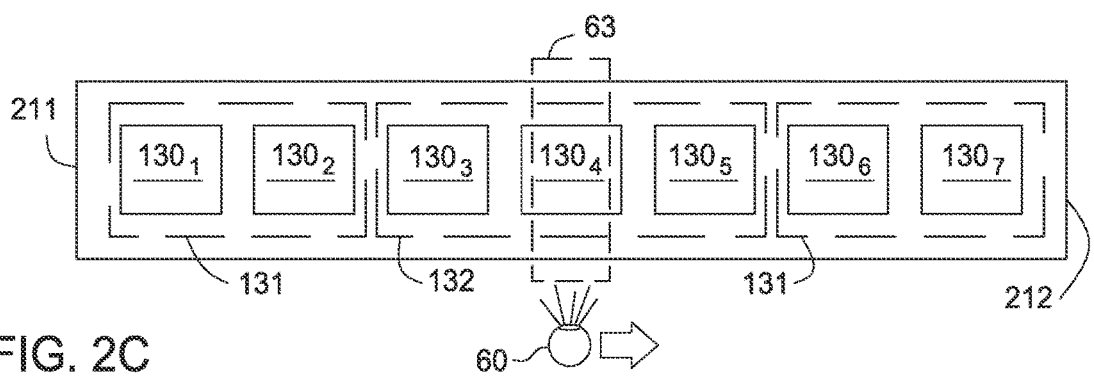

Referring next to FIG. 2C, the spray bar 60 is shown later in the processing sequence in a third position 63 in relation to the electrode assembly 135.

In FIG. 2C, the spray bar 60 has translated further towards second end 212 from the second position 62 shown in FIG. 2B to the third position 63 shown in FIG. 2C. As the spray bar 60 translates from the second position 62 to the third position 63, the controller 160 re-determines which electrode sets 130 belong in the first and second groups 131, 132. For example, the controller 160 in response to a determination that the spray bar 60 is currently in the third position 63, switches (i.e., reassigns) one or more electrode sets 130, such as electrode set $130_2$, from the second group 132 to the first group 131. The controller 160 also switches (i.e., reassigns) one or more electrode sets 130, such as electrode set $130_5$, from the first group 131 to the second group 132.

Figure 2D:
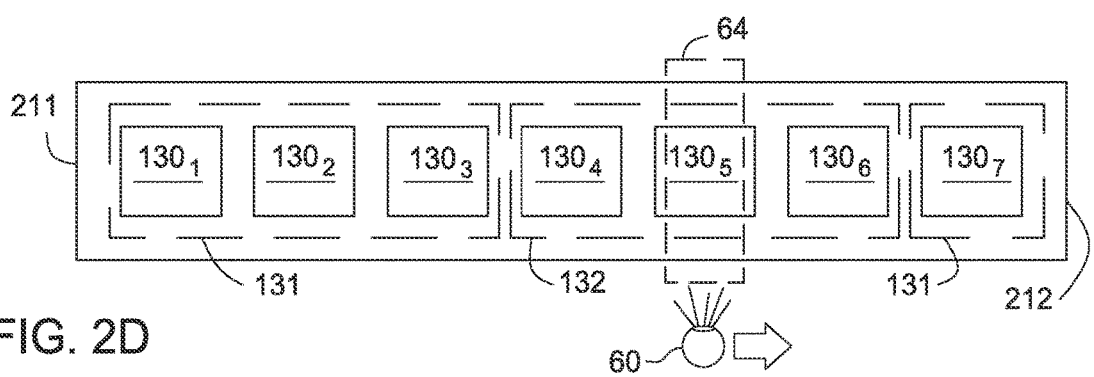

Referring next to FIG. 2D, the spray bar 60 is shown later in the processing sequence in a fourth position 64 in relation to the electrode assembly 135. In FIG. 2D, the spray bar 60 has translated further towards second end 212 from the third position 63 shown in FIG. 2C to the fourth position 64 shown in FIG. 2D. As the spray bar 60 translates from the third position 63 to the fourth position 64, the controller 160 re-determines which electrode sets 130 belong in the first and second groups 131, 132. For example, the controller 180 in response to a determination that the spray bar 60 is currently in the fourth position 64, switches (i.e., reassigns) one or more electrode sets 130, such as electrode set $130_3$, from the second group 132 to the first group 131. The controller 160 also switches (i.e., reassigns) one or more electrode sets 130, such as electrode set 130₆, from the first group 131 to the second group 132.

As illustrated in the sequence depicted in FIGS. 2A-2D, the electrode sets 130 assigned to the first group 131 to second group 132 changes in response to the position of the spray bar 60 or other information provided to the controller 160. Thus, in embodiments wherein deposition occurs incrementally across the substrate, such as advancing from one end of the substrate 10 to the other, the electrode sets 130 assigned to the first group 131 to second group 132 may sequentially switch in a wave-like pattern, e.g., Consecutively across the substrate carrier system 100, so that the portion of the electrode assembly 135 operating in the second Mode also traverses across the substrate carrier system 100 sequentially from adding one or more electrode set 130 to the second group 132 on the front-side of the group 132 in the direction of advance, while removing one or more electrode set 130 to the second group 132 from the back-side of the group 132.

Although FIGS. 2A-2D show the electrode sets 130 laterally spaced apart along the width dimension 210 of the electrode assembly 135, other arrangements can be used, such as a rectangular or square grid, or a circular arrangement, The arrangement of the electrode sets in an electrode assembly can be designed to match the geometries of areas on a substrate to be processed. For example, the rectangular spray bar 60 treating a rectangular area of the substrate 10 works well with the electrode sets 130 arranged in a rectangular pattern on the electrode assembly 135. If a spray bar can translate in more than one dimension, then a grid arrangement of electrode sets may be beneficial. If a spray bar can translate in a circular pattern, then a circular arrangement or grid arrangement of electrode sets may be beneficial.

Figure 3A:
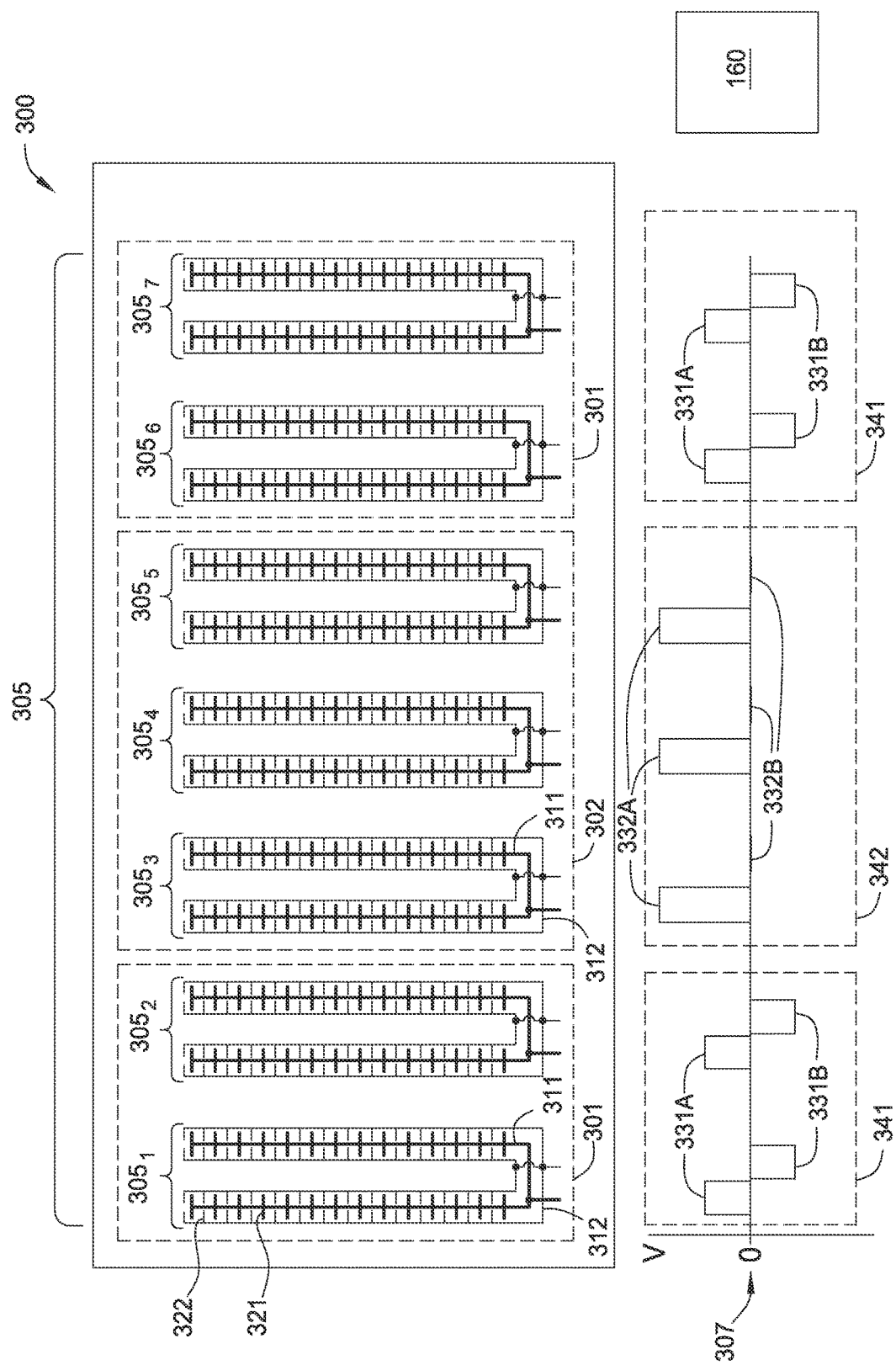
FIGS. 3A and 3B illustrate two operational states of an electrode assembly to be used in accordance with one embodiment.
Figure 3B:
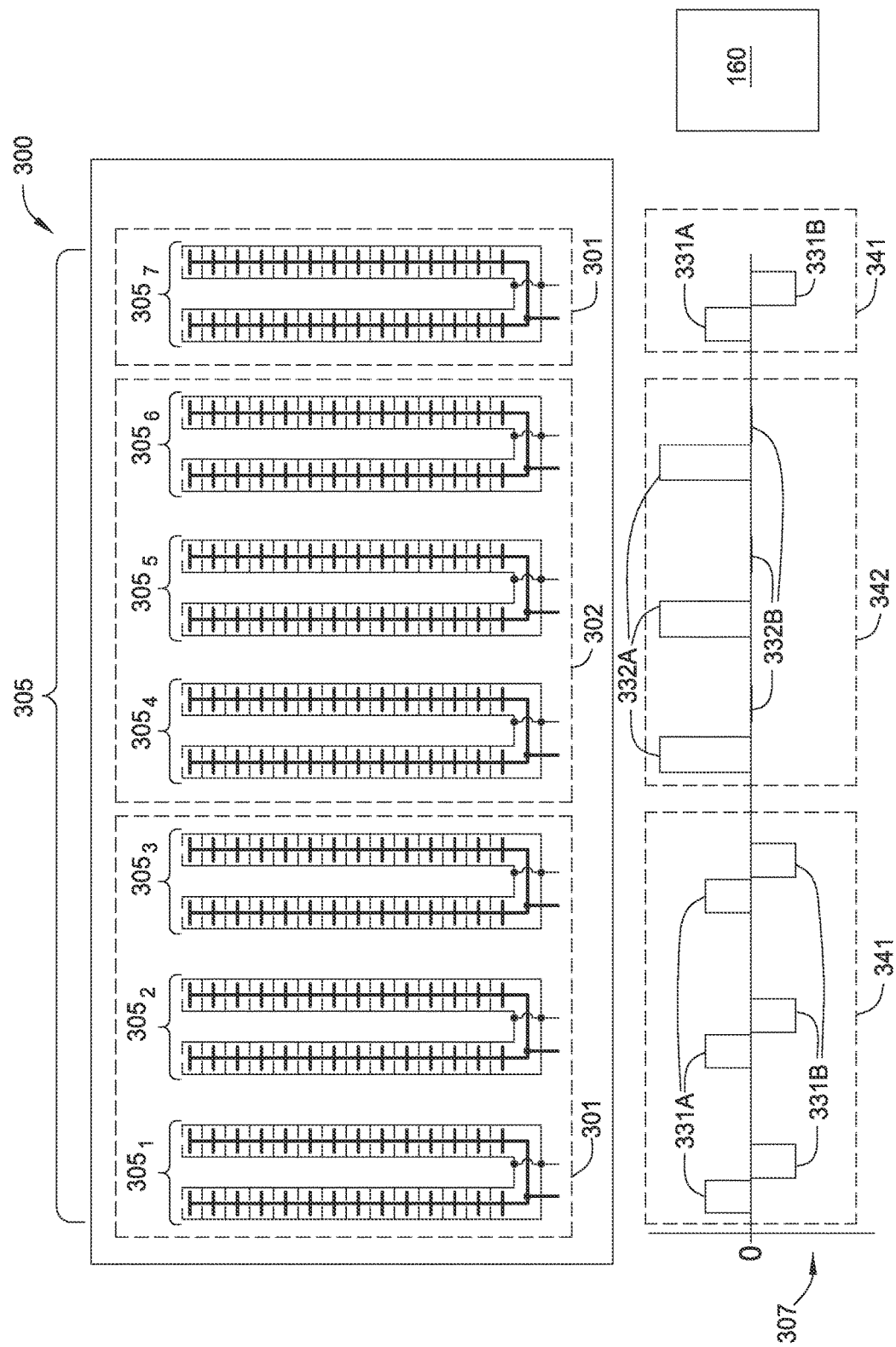

FIGS. 3A and 3B illustrate two (e.g., the first and second) operational states of an electrode assembly 300 in accordance with one embodiment. The electrode assembly 300 is advantageous particularly when used with a mask 20 that is held at ground, for example, the reference ground of the processing system 50 or earth ground. The electrode assembly 300 may be used as the electrode assembly 135 in the substrate carrier system 100, or other substrate carrier system. The electrode assembly 300 is coupled to the controller 160, which controls operation of the electrode assembly 300, for example as described above with reference to FIGS. 2A-2D. The electrode assembly 300 includes a plurality of laterally spaced apart electrode sets 305, and each individual electrode set $305_1$-$305_7$ includes a first electrode 311 interleaved with a second electrode 312. In one embodiment, each first electrode 311 includes a first set of fingers 321, and each second electrode 312 includes a second set of fingers 322. The first set of fingers 321 are interleaved with the second set of fingers 322. It is believed that interleaving the fingers 321, 322 provides a longer interface between the electrodes generating the electrostatic force, thus utilizing less power to generate greater electrostatic force, which takes longer to dissipate once power is removed, allowing the substrate 10 to remain chucked to the substrate carrier system 100 for short periods after power is removed.

A graph 307 illustrated below the electrode assembly 300 shows voltages applied to the first electrode 311 and the second electrode 312 of different electrode sets 305 selected according to the location of the electrode set 305 of the electrode assembly 300 relative to the spray bar 60 (as shown in FIGS. 2A-D). For example, the graph 307 shows a positive first clamping voltage 331A applied to the first electrode 311 of electrode sets $305_1$-$305_2$, $305_6$-$305_7$ and a negative first clamping voltage 331B applied to the second electrode 312 of electrode sets $305_1$-$305_2$, $305_6$-$305_7$. Alternatively, the positive first clamping voltage 331A can be provided to the second electrode 312 of electrode sets $305_1$-$305_2$, $305_6$-$305_7$ and the negative first clamping voltage 331B can be applied to the first electrode 311 of electrode sets $305_1$-$305_2$, $305_6$-$305_7$. The terms positive and negative refer to the amplitude of the first clamping voltage 331A and first clamping voltage 331B relative to the ground voltage of the mask 20, in the example depicted in FIGS. 3A-B, the ground voltage of the mask 20 is approximately zero Volts, the first clamping voltage 331A and first clamping voltage 331B have voltage of substantially equal amplitude by opposite polarity relative to the ground voltage of the mask 20. The polarity of the first clamping voltages 331A, 331B provided to each electrode 311, 312 can be reversible during operation.

The graph 307 also shows a second clamping voltage 332A being applied to the first electrode 311 of electrode sets $305_3$-$305_5$ and the voltage 332B being applied to the second electrode 312 of electrode sets $305_3$-$305_5$ being approximately equal to the ground voltage of the mask 20, e.g. about zero Volts, Alternatively, the second clamping voltage 332A can be provided to the second electrode 312 of electrode sets $305_3$-$305_5$, and the second clamping voltage 332B applied to the first electrode 311 of electrode sets $305_3$-$305_5$ be approximately equal to the ground voltage of the mask 20. The polarity of the second clamping voltage 332A provided to either electrode 311, 312 can be reversible during operation. The potential difference between the second clamping voltages 332A, 332B may be approximately equal to the potential difference between the first clamping voltages 331A, 331B, but since the second clamping voltage 332B is approximately equal to the ground voltage of the mask 20, the electrode assembly 300 functions as a monopolar electrostatic chuck when the electrode assembly 300 is operated in the second mode.

As discussed above, the controller 160 may be configured to select a first group 301 of the electrode sets 305 and a second group 302 of the electrode sets 305. The electrode sets 305 included in the first group 301 can be used to electrostatically damp the substrate 10 and the electrode sets 305 included in the second group 302 can be used to electrostatically damp the mask 20 over the substrate 10 to the protective layer stack 150 disposed on the outer mounting surface 114 as illustrated in FIG. 1C. The controller 160 tan be configured to operate the first group 301 of the electrode sets 305 in a first chucking mode by providing the first damping voltages 331A, 331B to at least the first group 301 of the electrode sets 305. The first damping voltages 331A, 331B can be DC voltages between about 500V and about 10,000V, for example about 3,000V. The electrodes 311, 312 function as a bipolar electrostatic chuck to the substrate 10 when the electrodes 311, 312 are operated in the first chucking mode. Since the chucking force generally does not extend through the substrate 10 when operated bipolar electrostatic chuck, the substrate 10 but not the mask 20 is chucked by regions of the electrode assembly 300 operating in the first chucking mode.

The controller 160 can also be configured to operate the second group 302 of the electrode sets 305 in a second chucking mode by providing the second clamping voltage 332A to the second group 302 of the electrode sets 305. The electrodes 311, 312 when operated in the second chucking mode functions as a monopolar electrostatic chuck because the second clamping voltage 332B is approximately equal to the ground voltage of the mask 20. The second clamping voltage 332A can be a DC voltage between about 600V and about 20,000V, for example about 6,000V. The second clamping voltage 332A can be a positive or negative voltage. The amplitude of the second clamping voltage 332A can be higher than the positive first clamping voltage 331A by a factor between about 0.25 and about 5, for example a factor of about 2. The high potential difference between the second clamping voltage 332A and grounded mask 20 is sufficient to chuck the mask 20 through the substrate 10 to the substrate carrier system 100.

In some embodiments, each electrode 311, 312 of each electrode set 305 may have two leads between the electrodes 311, 312 and the controller 160. Each lead may be held at the same voltage so that substantially no current flows through the electrodes 311, 312 in either chucking mode.

Referring to FIG. 3A and FIG. 3B, the controller 160 can be configured to selectively switch at least one electrode set, for example electrode set $305_6$, from the first group 301 as shown in FIG. 3A to the second group 302 as shown in FIG. 3B. The controller 160 can also be configured to selectively switch at least one electrode sot for example electrode set $305_3$, from the second group 302 as shown in FIG. 3A to the first group 301 as shown in FIG. 35. The controller 160 selects which of the electrode sets 305 are included in the first group 301 and the second group 302 based on a predefined criteria. such as the position of an external component (e.g., the spray bar 60) in relation to electrode assembly 300, the location of electrode assembly 300 within the processing chamber 55, according to a timed sequence, or other criteria.

Figure 4A:
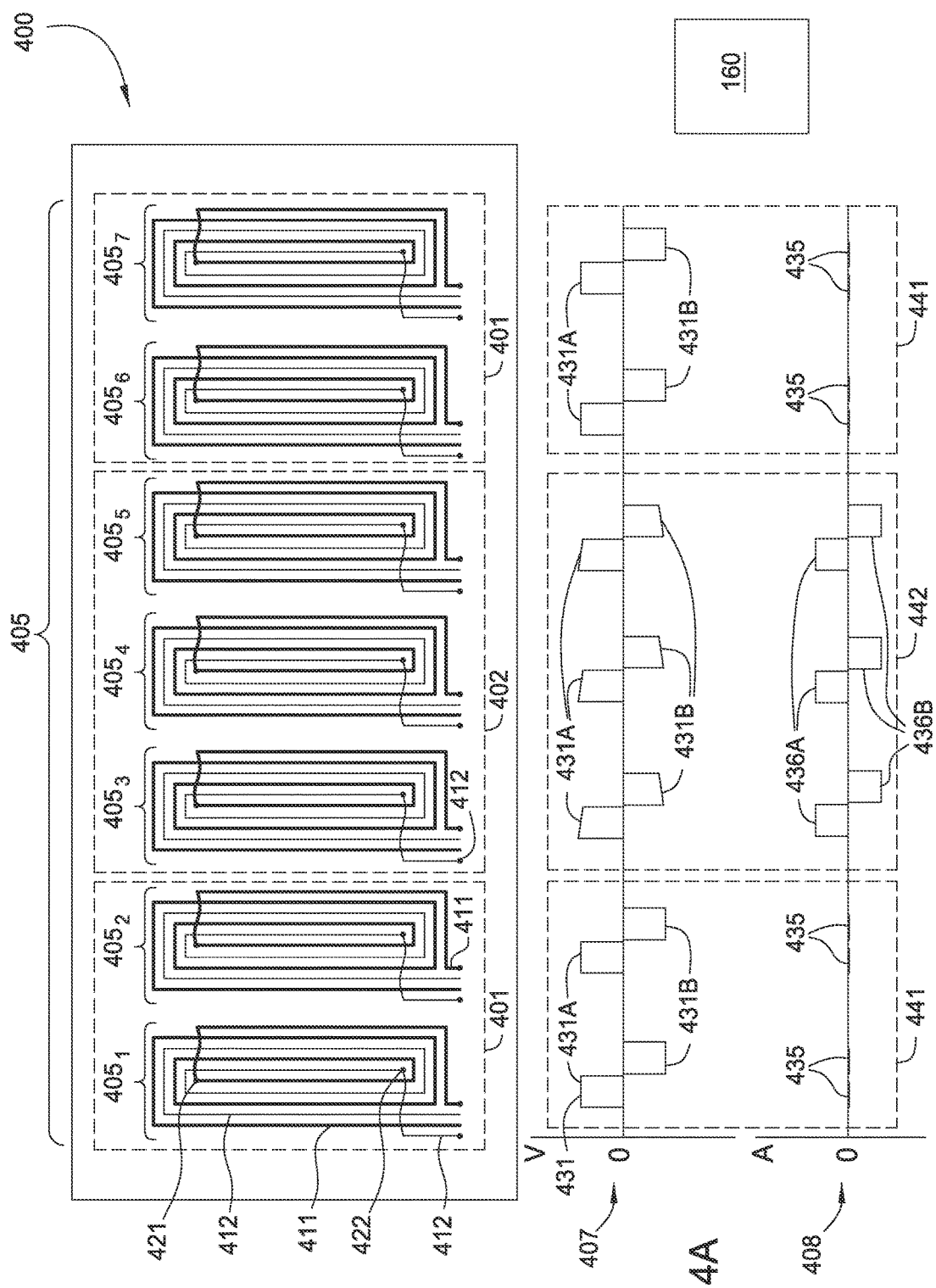
FIGS. 4A and 4B illustrate two operational states of an electrode assembly to be used in accordance with another embodiment.
Figure 4B:
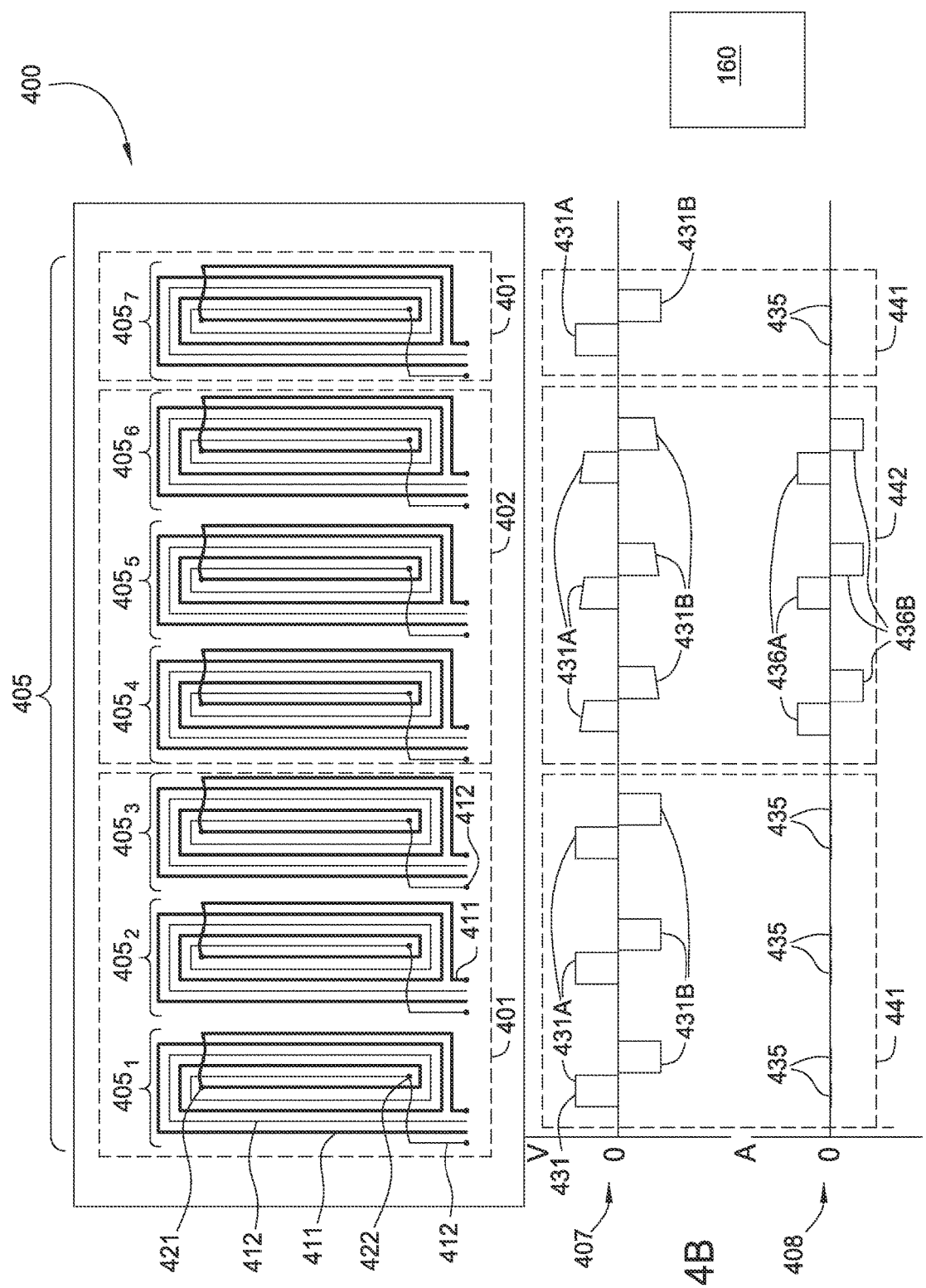

FIGS. 4A and 4B illustrate two operational states of an electrode assembly 400 in accordance with another embodiment. In the electrode assembly 400 is suitable for use with masks 20 that are electrically grounded or floating. The electrode assembly 400 may be used in as the electrode assembly 135 in the substrate carrier system 100, or other carrier system. The electrode assembly 400 is coupled to the controller 160, which controls operation of the electrode assembly 400, for example as described above with reference to FIGS. 2A-2D. The electrode assembly 400 includes a plurality of laterally spaced apart electrode sets 405, illustratively shown as electrode set $405_1$-$405_7$. Each individual electrode set $405_1$-$405_7$ includes a first electrode 411 interleaved with a second electrode 412. In one embodiment, each first electrode 411 includes a first coil 421, and each second electrode 412 includes a second coil 422. The first coil 421 is interleaved with the second coil 422. For the purposes of this disclosure, interleaved coils includes one coil disposed on top of a second coil, wherein one coil is not vertically superimposed over and aligned with the elements of the other coil.

Graphs 407, 408 below the electrode assembly 400 show voltages and currents applied to the first electrode 411 and the second electrode 412 for different electrode sets 405 of the electrode assembly 400 at different periods during processing of the substrate 10 retained by the electrode assembly 400. For example, the graph 407 shows a positive first clamping voltage 431A applied to the first electrode 411 of electrode sets $405_1$-$405_2$, $405_6$-$405_7$ and a negative first damping voltage 4318 applied to the second electrode 412 of electrode sets $405_1$-$405_2$, $405_6$-$405_7$. Alternatively, the positive first clamping voltage 431A can be provided to the second electrode 412 of electrode sets $405_1$-$405_2$, $405_6$-$405_7$ and the negative first clamping voltage 431B can be applied to the first electrode 411 of electrode sets $405_1$-$405_2$, $405_6$-$405_7$. The polarity of the first clamping voltages 431A, 431B provided to each electrode 411, 412 can be reversible during operation. The potential difference between the voltages applied to the electrode 411, 412 allows the electrode assembly 400 to function as a bi-polar electrostatic chuck to chuck the substrate 10 without chucking the mask 20. The graph 407 also shows the positive first clamping voltage 431A being applied to the first electrode 411 of electrode sets $405_3$-$405_5$, and the negative first clamping voltage 431B being applied to the second electrode 412 of electrode sets $405_3$-$405_5$. The slight slopes for the voltages 431A, 431B indicate a voltage drop across the leads of each electrodes 411, 412 as current flows through the electrodes 411, 412 of electrode sets $405_3$-$405_5$. The current flow through the electrodes 411, 412 of electrode sets $405_3$-$405_5$ creates an electromagnetic force that chucks the mask 20, being comprised of a magnetizable material, for example a metal containing material such as INVAR®, to the substrate carrier system 100 through the substrate 10.

The graph 408 shows substantially no current 435 being provided to or induced on the first electrode 411 or the second electrode 412 of electrode sets $405_1$-$405_2$, $405_6$-$405_7$, The graph 408 also shows a positive clamping current 436A being provided to the first electrode 411 of electrode sets $405_3$-$405_5$ and a negative clamping current 438B being provided to the second electrode 412 of electrode sets $405_3$-$405_5$. Alternatively, the positive clamping current 438A can be provided to the second electrode 412 of electrode sets $405_3$-$405_5$ and the negative clamping current 436B can be applied to the first electrode 411 of electrode sets $405_3$-$405_5$.

The controller 160 can be configured to select a first group 401 of the electrode sets 405 and a second group 402 of the electrode sets 405. The electrode sets 405 included in the first group 401 can be used to electrostatically clamp the substrate 10 to the protective layer stack 150 disposed on the outer mounting surface 114. The electrode sets 405 included in the second group 402 can be used to electromagnetically damp the mask 20 over the substrate 10 to the protective layer stack 150 disposed on the outer mounting surface 114 as illustrated in FIG. 1C. Current flowing through the electrode sets 405 in the second group 402 creates a magnetic field which attracts and secures the mask 20 to the substrate carrier system 100. The controller 160 can be configured to operate the first group 401 of the electrode sets 405 in a first chucking mode by providing the first clamping voltages 431A, 431B to at least the first group 401 of the electrode sets 405. The electrodes 411, 412 when operated in the first chucking mode function as a bipolar electrostatic chuck. The first clamping voltages 431A, 431B can be DC voltages between about 500V and about 10,000V, for example about 3,000V, The controller 160 can also be configured to operate the second group 402 of the electrode sets 405 in a second chucking mode by providing the positive clamping current 436A and the negative clamping current 436B to the second group 402 of the electrode sets 405. The electrode sets 405 when operated in the second chucking mode function as e bipolar electromagnetic chuck. The positive clamping current 436A and the negative damping current 436B can be between about 10 mA and about 10A, for example about 100 mA. In the embodiment shown in FIGS. 4A and 4B, the first clamping voltage 431 is applied to the electrode sets 405 in the first group 401 and the second group 402, making the voltages applied to the two groups 401, 402 equal or substantially equal. In some embodiments, a second clamping voltage (not shown) different from the first clamping voltage 431 can be applied to the electrode sets 405 in the second group 402.

Referring to FIGS. 4A-4B, the controller 160 can be configured to selectively switch at least one electrode set 405$_6$ from the first group 401 as shown in FIG. 4A to the second group 402 as shown in FIG. 4B. The controller 160 can also be configured to selectively switch at least one electrode set 405$_3$ from the second group 402 as shown in FIG. 4A to the first group 401 as shown in FIG. 4B. The controller 160 can switch the electrode sets 405 included in the first group 401 and the second group 402 based on a predefined criteria, such as the position of an external component (e.g., spray bar 60) in relation to electrode assembly 400, the location of electrode assembly 400 within the processing chamber 55, or according to a timed sequence.

Figure 5A:
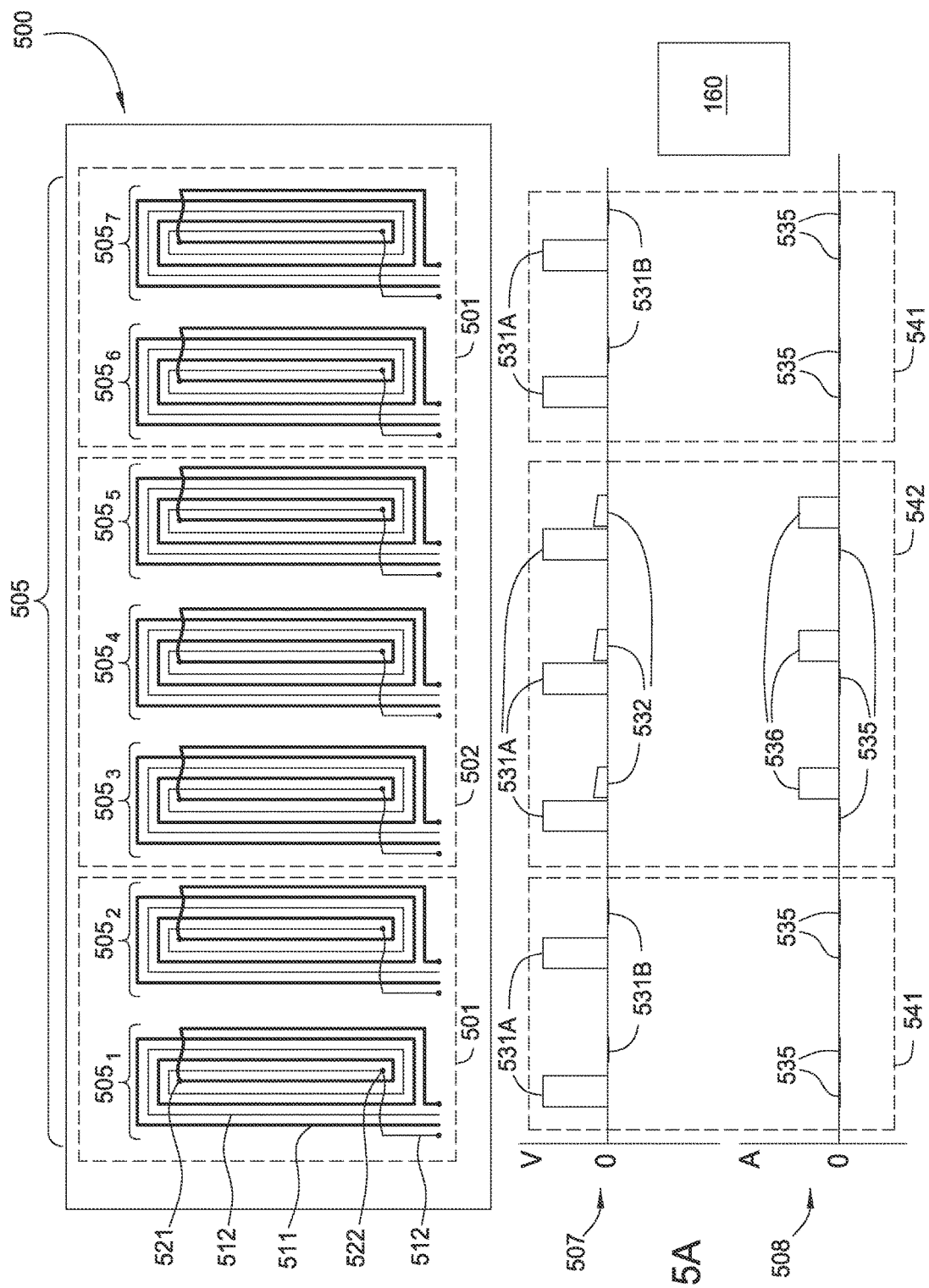
FIGS. 5A and 5B illustrate two operational states of an electrode assembly to be used in accordance with another embodiment.
Figure 5B:
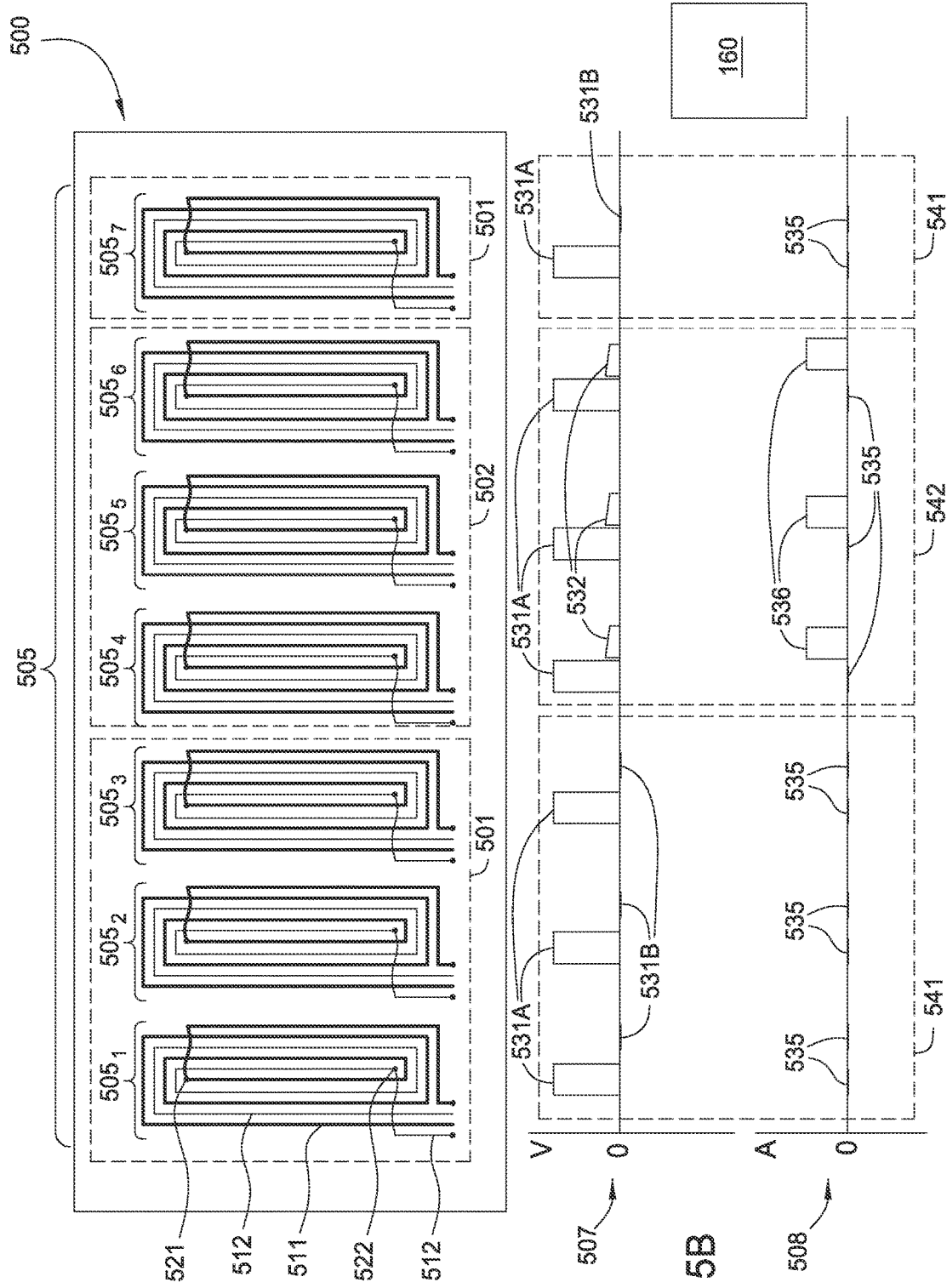

FIGS. 5A and 5B illustrate two operational states of an electrode assembly 500 in accordance with another embodiment. The electrode assembly 500 may be used as the electrode assembly 135 in the substrate carrier system 100, or other carrier system. The electrode assembly 500 is suitable for use with masks 20 comprised of a magnetizable material that are electrically ungrounded or electrically floating. The electrode assembly 500 is coupled to the controller 160, which controls operation of the electrode assembly 500, for example as described above with reference to FIGS. 2A-2D. The electrode assembly 500 includes a plurality of laterally spaced apart electrode sets 505, and each electrode set 505$_1$-505$_7$ includes a first electrode 511 interleaved with a second electrode 512. In one embodiment, each first electrode 511 includes a first coil 521 while each second electrode 512 includes a second coil 522. The first coil 521 is interleaved with the second coil 522.

Graphs 507, 508 below the electrode assembly 500 show voltages and currents or induced applied to the first electrode 511 and the second electrode 512 for different electrode sets 505 according to the location of the electrode set 505 on the electrode assembly 500. For example, graph 507 shows a first clamping voltage 531A being applied to the first electrode 511 of electrode sets 505$_1$-505$_2$, 505$_6$-505$_7$ and substantially no voltage 531B being applied to the second electrode 512 of electrode sets 505$_1$-505$_2$, 505$_6$-505$_7$. Alternatively, the first clamping voltage 531A can be provided to the second electrode 512 of electrode sets 505$_1$-505$_2$, 505$_6$-505$_7$ and substantially no voltage 531B can be applied to the first electrode 511 of electrode sets 505$_1$-505$_2$, 505$_6$-505$_7$. The polarity of the first clamping voltage 531A provided to either electrode 511, 512 can be reversible during operation. The graph 507 also shows the first clamping voltage 531A being applied to the first electrode 511 of electrode set 505$_3$-505$_6$, and a second clamping voltage 532 being applied to the second electrode 512 of electrode sets 505$_3$-505$_5$. The slight slope for the second clamping voltage 532 indicates a voltage drop as current flows through the second electrode 512 of electrode sets 505$_3$-505$_6$. The polarity of the second clamping voltage 532 provided to either electrode 511, 512 can also be reversible during operation. In some embodiments, the first clamping voltage 531A can be an opposite polarity to the second clamping voltage 532.

The graph 508 shows substantially no current 535 is provided to the first electrode 511 or second electrode 512 of electrode sets 505$_1$-505$_2$, 505$_6$-505$_7$. The graph 508 also shows a clamping current 536 being provided to the second electrode 512 of electrode sets 505$_3$-505$_5$ and substantially no current 535 being provided to the first electrode 511 of electrode sets 505$_3$-505$_5$. Alternatively, the clamping current 536 can be provided to the first electrode 511 of electrode sets 505$_3$-505$_5$ and the substantially no current 535 can be applied to the second electrode 512 of electrode sets 505$_3$-505$_5$.

The controller 160 can be configured to select a first group 501 of the electrode sets 505 and a second group 502 of the electrode sets 505. The electrode sets 505 included in the first group 501 can be used to electrostatically clamp the substrate 10 and the electrode sets 505 included in the second group 502 can be used to electromagnetically clamp the mask 20 over the substrate 10 to the protective layer stack 150 disposed on the outer mounting surface 114 as illustrated in FIG. 1C. The mask 20, which can be used with an embodiment including electrode assembly 500, can be composed of a magnetizable material, such as a ferromagnetic compound. Current flowing through the electrode sets 505 in the second group 502 creates a magnetic field which attracts and secures the mask 20 to the substrate carrier system 100. The controller 160 can be configured to operate the first group 501 of the electrode sets 505 in a first chucking mode by providing the first damping voltage 531A to at least the first group 501 of the electrode sets 505. The electrodes 511, 512 when operated in the first chucking mode function as a monopolar electrostatic chuck. The first clamping voltage 531A can be a DC voltage between about 500V and about 20,000V, for example about 6,000V.

The controller 160 can also be configured to operate the second group 502 of the electrode sets 505 in a second chucking mode by providing the clamping current 536 to the second group 502 of the electrode sets 505. The electrode sets 505 when operated in the second chucking mode function as a monopolar electromagnetic chuck.

The clamping current 536 can be between about 10 mA and about 10A, for example about 100 mA, Since the clamping current 536 is generated at tow voltages, the energy utilized to clamp the mask 20 is low compared to other chucking techniques. In some embodiments, a voltage different from the first clamping voltage 531A can be applied to the first electrode 511 of the electrode sets 505 in the second group 502 as opposed to the first group 501. The first clamping voltage 531A can be between about 5 to about 5,000 times higher than the second clamping voltage 532, for example about 10 times higher. In some embodiments, the second clamping voltage 532 can be a DC voltage less than about 100V, such as less than about 30V, for example about 10V.

Referring to FIGS. 5A and 5B, the controller 160 can be configured to selectively switch at least one electrode set 505, such as electrode sat 505$_6$, from the first group 501 as shown in FIG. 5A to the second group 602 as shown in FIG. 5B. The controller 160 can also be configured to selectively switch at least one electrode set 505, such as electrode set 505$_3$, from the second group 502 as shown in FIG. 5A to the first group 501 as shown in FIG. 5B. The controller 160 can switch the electrode sets 605 included in the first group 501 and the second group 502 based on a predefined criteria, such as the position of an external component (e.g., spray bar 60) in relation to electrode assembly 500, the location of electrode assembly 500 within the processing chamber 55, or according to a timed sequence.

Figure 6:
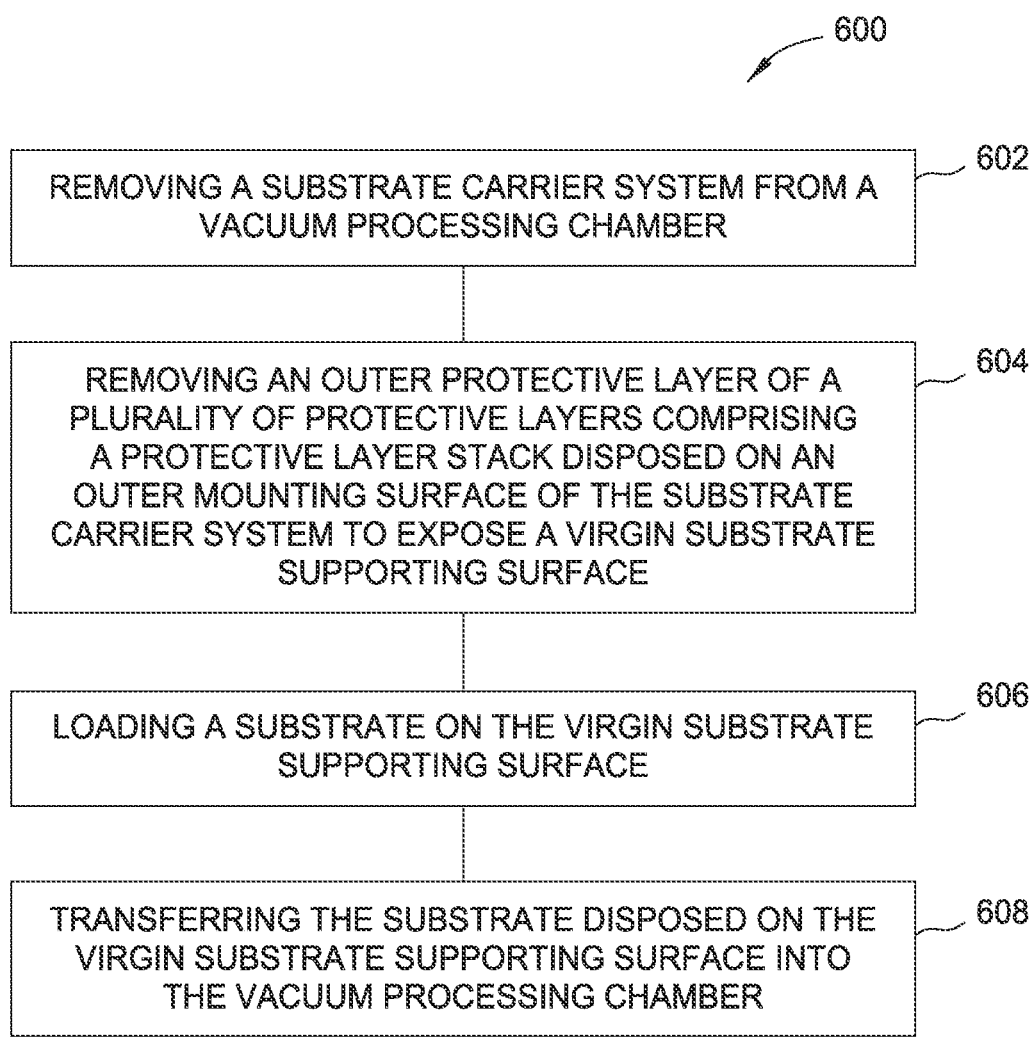
FIG. 6 is a process flow diagram of a method for transporting a substrate on a substrate carrier system.

FIG. 6 is a process flow diagram of a method 600 for transferring a substrate on a substrate carrier system, such as the substrate carrier system 100 described above. At block 602, the method 600 for transferring a substrate on a substrate carrier system includes removing a substrate carrier system from a vacuum processing chamber, such as the processing chamber 66 described above. At block 604, an outer protective layer of a plurality of protective layers 154 comprising a protective layer stack 150 disposed on an outer mounting surface 114 of the substrate carder system 100 is removed to expose an underlying protective layer of the plurality of protective layers to define a virgin substrate supporting surface 152. At block 606, the substrate 10 is loaded on the virgin substrate supporting surface 152. The substrate 10 loaded on the substrate supporting surface 152 may be electrostatically secured to the substrate carrier system by energizing an electrode assembly. At block 608, the substrate 10 disposed on the virgin substrate supporting surface 152 is transferred into the vacuum processing chamber 55.

Optionally, the method 600 may include determining that the outer protective layer 154 should be removed in response to a condition of a wear indicator 158 of the protective layer stack 150. The removing the outer protective layer of the protective layer stack 150 may also include peeling the outer protective layer 154 off of an underlying protective layer 154.

The method 600 may include performing a deposition process within the vacuum processing chamber 55. The deposition process may optionally include depositing an organic OLED material layer on the substrate within the vacuum processing chamber while the substrate is disposed on the substrate carrier system. The deposition process may be a thermal evaporation, plasma enhanced chemical vapor deposition or other deposition technique.

Thus, the substrate carrier system described herein includes a protective layer stack that enables the substrate to be electrostatically clamped to substrate carrier system with minimal damage to the substrate. The protective layer stack protects that substrate from defects which may occur should the substrate be directly chucked to the surface of the substrate carrier system, which improves product quality and manufacturing efficiency. The easily removable layers of protective layer stack allows to the substrate supporting surface of the carrier system to be maintained in a condition that minimizes defect generation.

While the foregoing is directed to typical embodiments, Other and further embodiments may be devised without departing from the basic scope thereof, and the scope thereof is determined by the claims that follow.

What is claimed is:

1. A substrate carrier system comprising:
a substrate carrier body configured to be transported into and out of a processing chamber, the substrate carrier body having an outer mounting surface and an electrode assembly, the electrode assembly comprising a plurality of laterally spaced apart sets of electrodes; and
a protective layer stack disposed on the outer mounting surface of the substrate carrier body, the protective layer stack comprising a plurality of removable protective layers, each removable protective layer adhered to at least one other removable protective layer in the stack, an outermost layer of the plurality of removable protective layers defining a substrate supporting surface of the substrate carrier for chucking a substrate thereon.

2. The substrate carrier system of claim 1, wherein the substrate carrier body is an electrostatic chuck.

3. The substrate carrier system of claim 2, wherein at least one set of electrodes comprises:
a first electrode interleaved with a second electrode.

4. The substrate carrier system of claim 1, wherein the substrate carrier body is an electromagnet.

5. The substrate carrier system of claim 1, wherein at least one of the protective layers is fabricated from polyimide, polyester, polyether ether ketone, or polyaryletherketone.

6. The substrate carrier system of claim 1, wherein each removable protective layer comprises a wear indicator.

7. The substrate carrier system of claim 1, further comprising an adhesive layer disposed between each removable protective layer.

8. The substrate carrier system of claim 1, wherein the protective layer stack has between 2 and 15 removable protective layers.

9. The substrate carrier system of claim 7, wherein a bottom of at least one removable protective layer is treated to cause the adhesive layer to preferentially adheres to the bottom of the protective layer relative to an adjacent one of the protective layers.

10. A vacuum processing system comprising:
a vacuum processing chamber;
a substrate carrier system comprising:
a substrate carrier body having an outer mounting surface and an electrode assembly, the electrode assembly operable to secure a substrate to the substrate carrier system when energized; and
a protective layer stack coupled to the outer mounting surface, the protective layer stack defining a substrate supporting surface of the substrate carrier system, the protective layer stack having a plurality of removable protective layers; and
a transport mechanism operable to move the substrate carrier system into and out of the vacuum processing chamber while maintaining a substantially vertical orientation of the outer mounting surface.

11. The vacuum processing system of claim 10, wherein the substrate carrier system further comprises:
a guide rail extending from the substrate carrier body and engaging the transport mechanism.

12. A method for transferring a substrate comprising:
removing a substrate carrier system from a vacuum processing chamber;
removing an outer protective layer of a plurality of protective layers comprising a protective layer stack disposed on an outer mounting surface of the substrate carrier system to expose an underlying protective layer of the plurality of protective layers to define a virgin substrate supporting surface;
loading a substrate on the virgin substrate supporting surface; and
transporting the substrate disposed on the virgin substrate supporting surface into the vacuum processing chamber.

13. The method of claim 12 further comprising:
determining that the outer protective layer should be removed in response to a condition of a wear indicator of the outer protective layer.

14. The method of claim 12 further comprising:
electrostatically chucking the substrate to the substrate carrier system.

15. The method of claim 12, wherein removing the outer layer comprises:
peeling the outer protective layer off of the underlying protective layer.

16. The substrate carrier system of claim 1, wherein the substrate carrier body is fabricated from a ceramic material.

17. The substrate carrier system of claim 1, wherein each removable protective layer is between about 0.1 mils thick and about 10 mils thick.

18. The substrate carrier system of claim 1 further comprising:
   a base coupled to the substrate carrier body, the base fabricated from a metallic material.

19. The substrate carrier system of claim 1 further comprising a controller and a battery disposed on or in the substrate carrier body.

20. The method of claim 12 further comprising:
   depositing an organic OLED material layer on the substrate within the vacuum processing chamber while the substrate is disposed on the substrate carrier system.

* * * * *

UNITED STATES PATENT AND TRADEMARK OFFICE
CERTIFICATE OF CORRECTION

PATENT NO. : 10,096,509 B2
APPLICATION NO. : 15/123231
DATED : October 9, 2018
INVENTOR(S) : Zuoqian Wang et al.

It is certified that error appears in the above-identified patent and that said Letters Patent is hereby corrected as shown below:

In the Specification

In Column 8, Line 49, delete "damping" and insert -- clamping --, therefor.

In Column 8, Line 60, delete "135," and insert -- 135. --, therefor.

In Column 9, Lines 30-31, delete "Communication" and insert -- communication --, therefor.

In Column 9, Line 39, delete "110," and insert -- 110. --, therefor.

In Column 10, Line 9, delete "carder" and insert -- carrier --, therefor.

In Column 10, Line 35, after "switches" insert -- (i.e., --.

In Column 10, Line 62, delete "180" and insert -- 160 --, therefor.

In Column 11, Lines 11-12, delete "Consecutively" and insert -- consecutively --, therefor.

In Column 11, Line 14, delete "Mode" and insert -- mode --, therefor.

In Column 11, Lines 23-24, delete "arrangement," and insert -- arrangement. --, therefor.

In Column 12, Line 10, delete "20, in" and insert -- 20. In --, therefor.

In Column 12, Line 22, delete "e.g." and insert -- e.g., --, therefor.

In Column 12, Line 23, delete "Volts," and insert -- Volts. --, therefor.

In Column 12, Line 42, delete "damp" and insert -- clamp --, therefor.

Signed and Sealed this
Eleventh Day of December, 2018

Andrei Iancu
*Director of the United States Patent and Trademark Office*

CERTIFICATE OF CORRECTION (continued)
U.S. Pat. No. 10,096,509 B2

In Column 12, Line 44, delete "damp" and insert -- clamp --, therefor.

In Column 12, Line 47, delete "tan" and insert -- can --, therefor.

In Column 12, Line 49, delete "damping" and insert -- clamping --, therefor.

In Column 12, Line 50, delete "damping" and insert -- clamping --, therefor.

In Column 12, Line 53, delete "311 ," and insert -- 311, --, therefor.

In Column 13, Line 21, delete "sot" and insert -- set, --, therefor.

In Column 13, Line 23, delete "35." and insert -- 3B. --, therefor.

In Column 13, Line 26, delete "criteria." and insert -- criteria, --, therefor.

In Column 13, Line 60, delete "damping" and insert -- clamping --, therefor.

In Column 13, Line 60, delete "4318" and insert -- 431B --, therefor.

In Column 14, Line 21, delete "$405_7$," and insert -- $405_7$. --, therefor.

In Column 14, Line 23, delete "438B" and insert -- 436B --, therefor.

In Column 14, Line 26, delete "438A" and insert -- 436A --, therefor.

In Column 14, Line 37, delete "damp" and insert -- clamp --, therefor.

In Column 14, Line 50, delete "3,000V," and insert -- 3,000V. --, therefor.

In Column 14, Line 56, delete "e" and insert -- a --, therefor.

In Column 14, Line 58, delete "damping" and insert -- clamping --, therefor.

In Column 15, Line 51, delete "$-505_6$," and insert -- $-505_5$, --, therefor.

In Column 15, Line 55, delete "$-505_6$." and insert -- $-505_5$. --, therefor.

In Column 15, Line 57, delete "operation," and insert -- operation. --, therefor.

In Column 16, Line 20, delete "damping" and insert -- clamping --, therefor.

In Column 16, Line 33, delete "100 mA," and insert -- 100 mA. --, therefor.

In Column 16, Line 34, delete "tow" and insert -- low --, therefor.

CERTIFICATE OF CORRECTION (continued)
U.S. Pat. No. 10,096,509 B2

In Column 16, Line 48, delete "sat" and insert -- set --, therefor.

In Column 16, Line 49, delete "602" and insert -- 502 --, therefor.

In Column 16, Line 54, delete "605" and insert -- 505 --, therefor.

In Column 16, Line 66, delete "66" and insert -- 55 --, therefor.

In Column 17, Line 2, delete "carder" and insert -- carrier --, therefor.

In Column 17, Line 41, delete "Other" and insert -- other --, therefor.